United States Patent
Yamamoto et al.

(10) Patent No.: US 9,893,194 B2
(45) Date of Patent: Feb. 13, 2018

(54) METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventors: Yoshitaka Yamamoto, Yamatokoriyama (JP); Tetsuhiro Tanaka, Atsugi (JP); Takayuki Inoue, Sagamihara (JP); Hideomi Suzawa, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 153 days.

(21) Appl. No.: 14/476,767

(22) Filed: Sep. 4, 2014

(65) Prior Publication Data
US 2015/0069385 A1 Mar. 12, 2015

(30) Foreign Application Priority Data
Sep. 12, 2013 (JP) .................................. 2013-189222

(51) Int. Cl.
*H01L 29/786* (2006.01)
*H01L 29/66* (2006.01)
(Continued)

(52) U.S. Cl.
CPC .......... *H01L 29/7869* (2013.01); *G11C 11/24* (2013.01); *G11C 16/0466* (2013.01);
(Continued)

(58) Field of Classification Search
CPC ........... H01L 29/7869; H01L 29/42384; H01L 29/4908; H01L 29/7881; H01L 29/66969; H01L 27/1225
(Continued)

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Bersuker et al., "Mechanism of Electron Trapping," IEEE Transactions on Device and Materials Reliability, vol. 7, No. 1, Mar. 2007; pp. 138-144.*

(Continued)

*Primary Examiner* — Bo Fan
(74) *Attorney, Agent, or Firm* — Robinson Intellectual Property Law Office; Eric J. Robinson

(57) ABSTRACT

A method for adjusting threshold of a semiconductor device is provided. In a plurality of semiconductor devices each including a semiconductor, a source or drain electrode electrically in contact with the semiconductor, a gate electrode, and a charge trap layer between a gate electrode and the semiconductor, a state where the potential of the gate electrode is set higher than the potential of the source or drain electrode while the semiconductor devices are heated at 150° C. or higher and 300° C. or lower is kept for one second or longer to trap electrons in the charge trap layer, so that the threshold is increased and Icut is reduced. Here, the potential difference between the gate electrode and the source or drain electrode is set so that it is different between the semiconductor devices, and the thresholds of the semiconductor devices are adjusted to be appropriate to each purpose.

14 Claims, 19 Drawing Sheets

(51) Int. Cl.
  *H01L 29/788* (2006.01)
  *H01L 29/423* (2006.01)
  *H01L 29/49* (2006.01)
  *H01L 27/12* (2006.01)
  *G11C 16/04* (2006.01)
  *G11C 16/34* (2006.01)
  *G11C 11/24* (2006.01)
  *G11C 7/04* (2006.01)
  *G11C 14/00* (2006.01)

(52) U.S. Cl.
  CPC ...... *G11C 16/3404* (2013.01); *H01L 27/1225* (2013.01); *H01L 29/42384* (2013.01); *H01L 29/4908* (2013.01); *H01L 29/66969* (2013.01); *H01L 29/7881* (2013.01); *H01L 29/78648* (2013.01); *H01L 29/78696* (2013.01); *G11C 7/04* (2013.01); *G11C 14/0054* (2013.01)

(58) Field of Classification Search
  USPC .................................................. 257/43, 402
  See application file for complete search history.

(56) References Cited

U.S. PATENT DOCUMENTS

| | | | |
|---|---|---|---|
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,876,145 B1 * | 4/2005 | Yamazaki | H01L 27/3244 313/504 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,791,072 B2 | 9/2010 | Kumomi et al. | |
| 7,989,899 B2 * | 8/2011 | Yin | H01L 21/84 257/402 |
| 8,237,166 B2 | 8/2012 | Kumomi et al. | |
| 8,384,080 B2 | 2/2013 | Taniguchi et al. | |
| 8,486,774 B2 | 7/2013 | Terai et al. | |
| 8,547,771 B2 | 10/2013 | Koyama | |
| 8,692,252 B2 | 4/2014 | Takata et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/1018235 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2012/0056175 A1 | 3/2012 | Takemura | |
| 2012/0132903 A1 * | 5/2012 | Yamazaki | H01L 21/0242 257/43 |
| 2014/0097867 A1 | 4/2014 | Koyama | |
| 2015/0008428 A1 | 1/2015 | Yamamoto et al. | |
| 2015/0011046 A1 | 1/2015 | Tanaka et al. | |
| 2015/0024577 A1 | 1/2015 | Kato et al. | |
| 2015/0054548 A1 | 2/2015 | Kato et al. | |
| 2015/0060846 A1 | 3/2015 | Yamamoto et al. | |
| 2015/0069387 A1 | 3/2015 | Yamamoto et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |

(56) References Cited

FOREIGN PATENT DOCUMENTS

| | | |
|---|---|---|
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2011-124360 A | 6/2011 |
| JP | 2011-138934 A | 7/2011 |
| JP | 2012-074692 A | 4/2012 |
| JP | 2012-257187 A | 12/2012 |
| WO | WO-2004/114391 | 12/2004 |

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A) May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digeset of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et at, "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the $In_2O_3$ and $ScO_3$—$A_2O_3$—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m =7, 8, 9, and 16) in the $In_2O_3$—$ZnGa_2O_4$—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

(56) References Cited

OTHER PUBLICATIONS

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara. H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m <4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID , Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

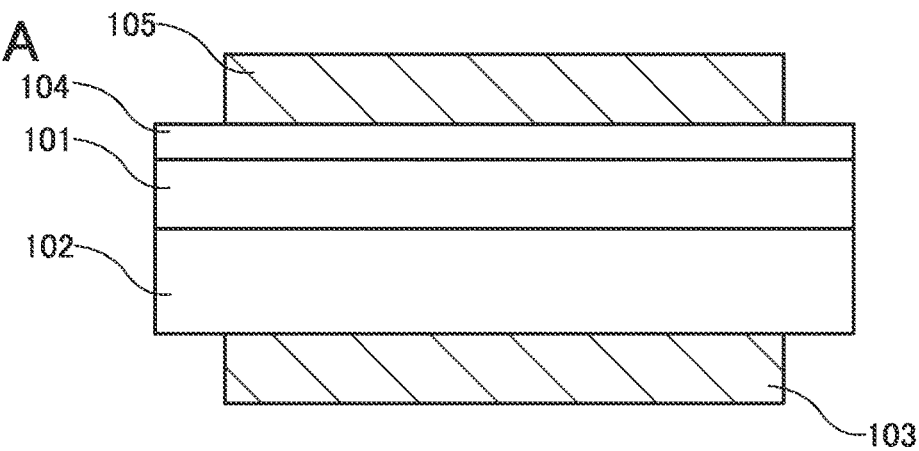
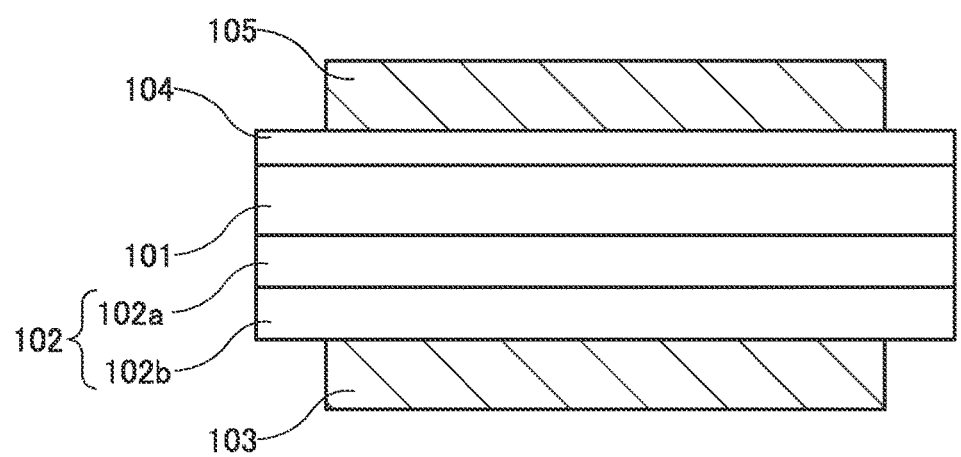
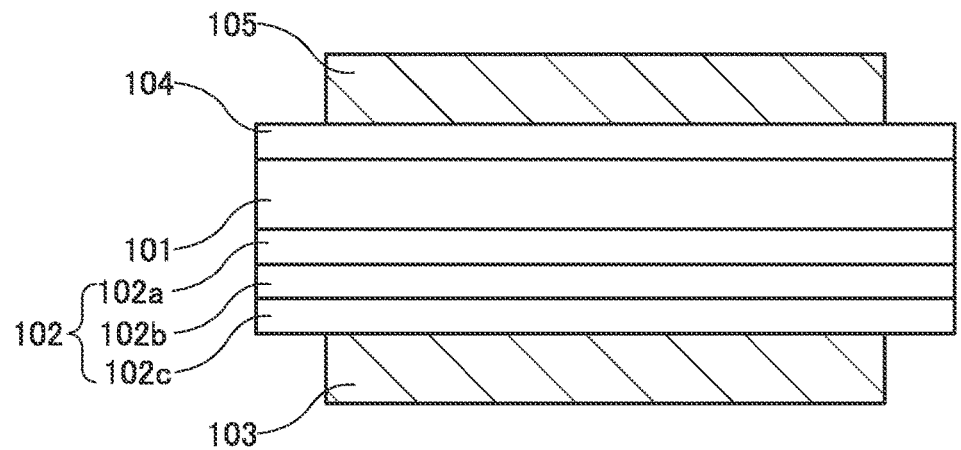

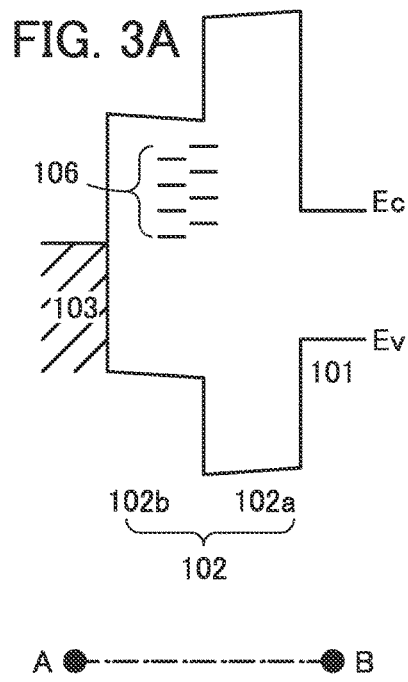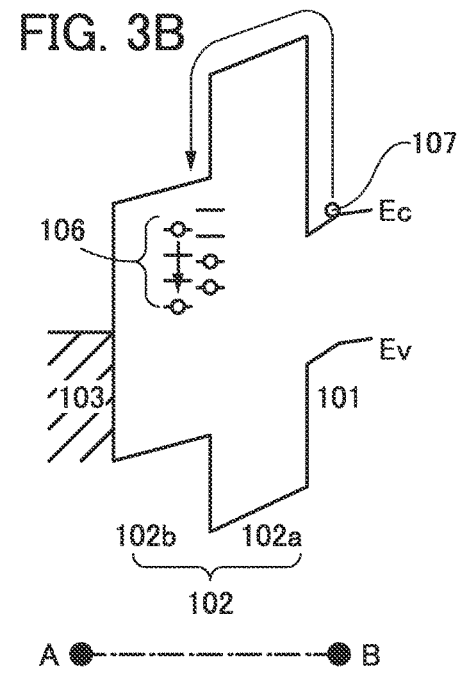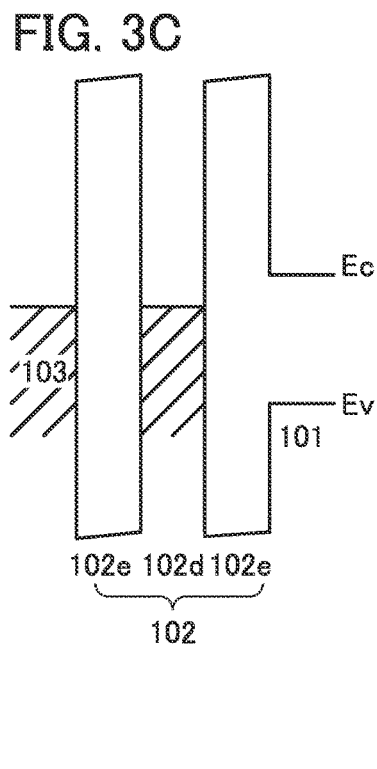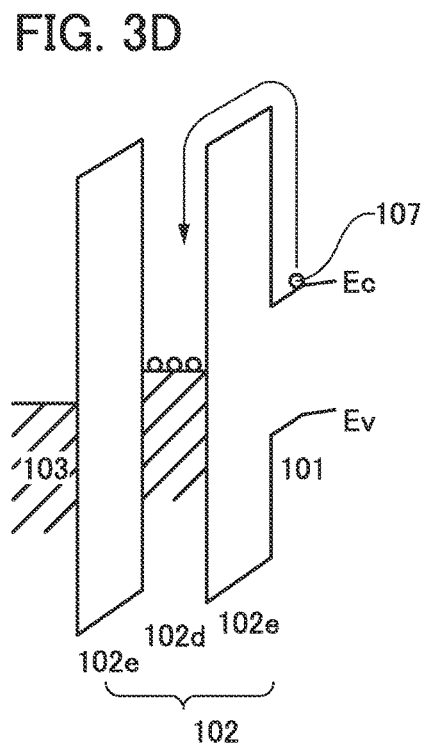

108 Id-Vg characteristics before process
109 Id-Vg characteristics after process Measurement of initial characteristics Injection of electrons Measurement Shipment

METHOD FOR MANUFACTURING SEMICONDUCTOR DEVICE

BACKGROUND OF THE INVENTION

1. Field of the Invention

One embodiment relates to a semiconductor device.

2. Description of the Related Art

The transistor is applied to a wide range of electronic devices such as an integrated circuit (IC) or an image display device. A silicon-based semiconductor material is widely known as a material for a semiconductor applicable to a transistor.

As another material, an oxide semiconductor has been attracting attention. For example, a transistor including an amorphous oxide semiconductor layer containing indium (In), gallium (Ga), and zinc (Zn) is disclosed in Patent Document 1.

Techniques for improving carrier mobility by stacking oxide semiconductor layers are disclosed in Patent Documents 2 and 3.

It is known that a transistor including an oxide semiconductor layer has an extremely small leakage current when the transistor is off. For example, a low-power-consumption CPU utilizing the small leakage current characteristic of a transistor including an oxide semiconductor layer is disclosed (see Patent Document 4).

REFERENCE

Patent Document

[Patent Document 1] Japanese Published Patent Application No. 2006-165528
[Patent Document 2] Japanese Published Patent Application No. 2011-124360
[Patent Document 3] Japanese Published Patent Application No. 2011-138934
[Patent Document 4] Japanese Published Patent Application No. 2012-257187
[Patent Document 5] Japanese Published Patent Application No. 2012-074692

SUMMARY OF THE INVENTION

Miniaturization of transistors has been progressing with an increase in the degree of integration of circuits. The miniaturization of a transistor may cause deterioration of electrical characteristics, such as on-state current, off-state current, threshold, and an S value (subthreshold swing), of the transistor (see Patent Document 5).

In view of the above, an object is to provide a semiconductor device whose threshold is corrected; a semiconductor device in which deterioration of electrical characteristics which becomes more noticeable as miniaturization progresses can be suppressed: a highly integrated semiconductor device: a semiconductor device in which deterioration of on-state current characteristics is reduced; a semiconductor device with low power consumption; a highly reliable semiconductor device; a semiconductor device capable of holding data even when power supply is stopped; or a semiconductor device with good characteristics. Objects other than the above object are apparent from and can be derived from the description of the specification, the drawings, the claims, and the like.

One embodiment of the present invention is a method for manufacturing a semiconductor device including a first semiconductor device and a second semiconductor device each of which includes a first semiconductor, an electrode which is electrically in contact with the first semiconductor, and a first gate electrode, and a charge trap layer between the first gate electrode and the first semiconductor. The state where a first potential difference between the first gate electrode and the electrode of the first semiconductor device is different from a second potential difference between the first gate electrode and the electrode of the second semiconductor device is kept at higher than or equal to 150° C. and lower than or equal to 300° C. for one minute to one hour to make the thresholds of the first semiconductor device and the second semiconductor device different from each other.

One embodiment of the present invention can provide a semiconductor device whose threshold is corrected; a semiconductor device in which deterioration of electrical characteristics which becomes more noticeable as miniaturization progresses can be suppressed; a highly integrated semiconductor device; a semiconductor device in which deterioration of on-state current characteristics is reduced; a semiconductor device with low power consumption: a highly reliable semiconductor device; a semiconductor device capable of holding data even when power supply is stopped; or a semiconductor device with good characteristics, or can solve an object which is apparent from and can be derived from the description of the specification, the drawings, the claims, and the like.

BRIEF DESCRIPTION OF THE DRAWINGS

FIGS. 2A to 2C illustrate examples of a semiconductor device of an embodiment.

FIGS. 3A to 3D illustrate band diagram examples of a semiconductor device of an embodiment.

DETAILED DESCRIPTION OF THE INVENTION

Figure 1A:
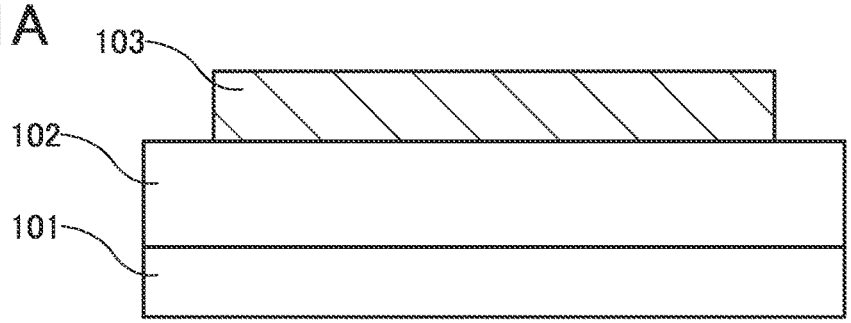
FIGS. 1A to 1D illustrate examples of a semiconductor device of an embodiment.

Embodiments will be described in detail with reference to drawings. Note that the present invention is not limited to the description below, and it is easily understood by those skilled in the art that a variety of modifications can be made to the modes and details without departing from the spirit and scope of the present invention. Therefore, the present invention should not be interpreted as being limited to the following description of the embodiments.

Note that in the structures described below, the same portions or portions having similar functions are denoted by the same reference numerals in common in different drawings and repetitive description thereof will be omitted.

Note that functions of a "source" and a "drain" of a transistor are sometimes replaced with each other when a transistor of opposite polarity is used or when the direction of current flowing is changed in circuit operation, for example. Therefore, the terms "source" and "drain" can be replaced with each other in this specification.

Note that in this specification and the like, ordinal numbers such as "first" and "second" are used in order to avoid confusion among components and do not limit the components numerically.

Embodiment 1

In this embodiment, a structure and operation principles of a semiconductor device including a semiconductor layer, a charge trap layer, and a gate electrode, and a circuit to which the semiconductor device is used will be described. FIG. 1A illustrates a semiconductor device including a semiconductor layer 101, a charge trap layer 102, and a gate electrode 103. The charge trap layer 102 can serve as a gate insulating layer.

Figure 1B:
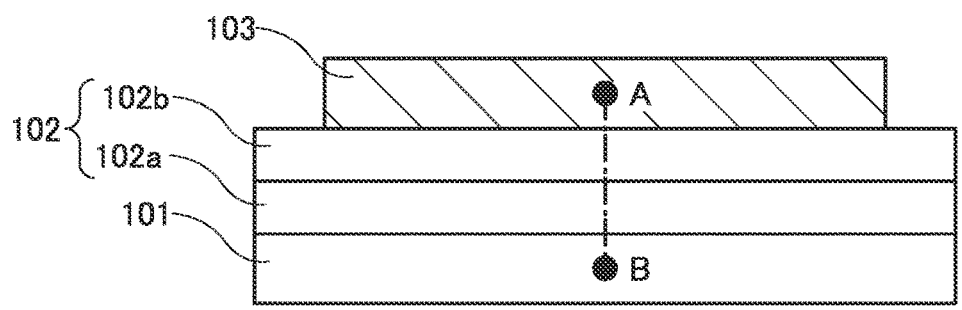
Figure 1C:
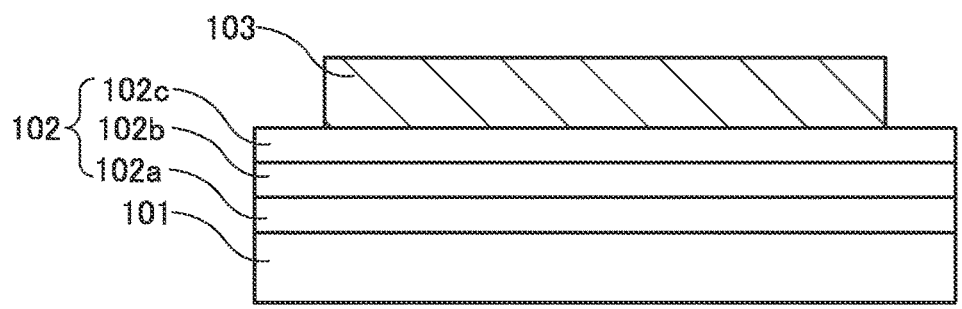
Figure 1D:
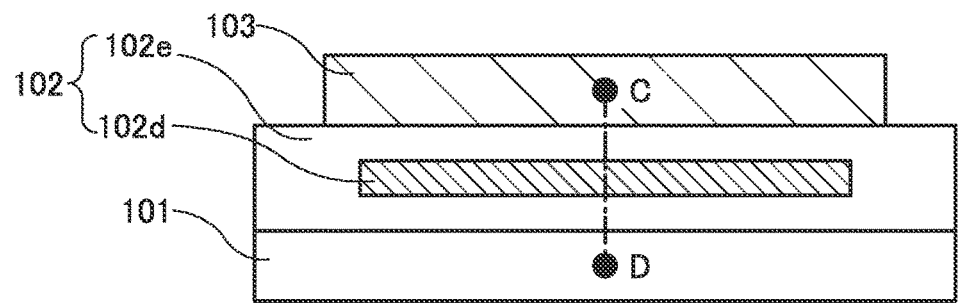

Here, the charge trap layer 102 may be a stacked body that includes a first insulating layer 102a and a second insulating layer 102b as illustrated in FIG. 1B, for example. Alternatively, the charge trap layer 102 may be a stacked body that includes the first insulating layer 102a, the second insulating layer 102b, and a third insulating layer 102c as illustrated in FIG. 1C, or a stacked body including four or more insulating layers. Alternatively, the charge trap layer 102 may include an electrically insulated conductive layer 102d in an insulator 102e as illustrated in FIG. 1D. The insulator 102e may be composed of a plurality of insulating layers.

Alternatively, a semiconductor device may include, as in FIG. 2A, the semiconductor layer 101, the charge trap layer 102, the gate electrode 103, a gate insulating layer 104, a gate electrode 105.

Here, the charge trap layer 102 may be a stacked body that includes a first insulating layer 102a and a second insulating layer 102b as illustrated in FIG. 2B, for example. Alternatively, the charge trap layer 102 may be a stacked body that includes the first insulating layer 102a, the second insulating layer 102b, and a third insulating layer 102c as illustrated in FIG. 2C, or a stacked body including four or more insulating layers. Alternatively, the charge trap layer 102 may include an electrically insulated conductive layer in an insulator as illustrated in FIG. 1D.

FIG. 3A is an example of a band diagram between points A and B in the semiconductor device illustrated in FIG. 1B. In FIGS. 3A to 3D, Ec and Ev denote the conduction band minimum and the valence band maximum, respectively. In FIG. 3A, the potential of the gate electrode 103 is equal to the potential of a source electrode or drain electrode (not illustrated).

In this example, the band gap of the first insulating layer 102a is larger than that of the second insulating layer 102b, and the electron affinity of the first insulating layer 102a is smaller than that of the second insulating layer 102b; however, the present invention is not limited to this example.

Electron trap states 106 exist at the interface between the first insulating layer 102a and the second insulating layer 102b or inside the second insulating layer 102b. FIG. 3B shows the state where the potential of the gate electrode 103 is higher than the potential of the source or drain electrode. The potential of the gate electrode 103 may be higher than the potential of the source or drain electrode by 1 V or more. The potential of the gate electrode 103 may be lower than the highest potential applied to the gate electrode 105 after this process. In the process, the difference between the potential of the gate electrode 103 and the potential of the source or drain electrode is typically less than 4 V.

Electrons 107 that exist in the semiconductor layer 101 move toward the gate electrode 103 having a higher potential. Some of the electrons 107 moving from the semiconductor layer 101 toward the gate electrode 103 are trapped by the electron trap states 106.

There are some processes to enable the electrons 107 to go over the barrier of the first insulating layer 102a to reach the second insulating layer 102b. The first is a process by the tunnel effect. The thinner the first insulating layer 102a is, the more prominent the tunnel effect is. Note that electrons trapped by the electron trap states 106 might sometimes return to the semiconductor layer 101 by the tunnel effect.

Even when the first insulating layer 102a is relatively thick, the tunnel effect (Fowler-Nordheim tunnel effect) can be obtained by applying an appropriate voltage to the gate electrode 103. In the case of the Fowler-Nordheim tunnel effect, a tunnel current increases with the square of the electric field between the gate electrode 103 and the semiconductor layer 101.

The second is the process that the electrons 107 hop from trap states to trap states in the band gap such as defect states in the first insulating layer 102a to reach the second insulating layer 102b. This is a conduction mechanism called Poole-Frenkel conduction, in which as the absolute temperature is higher and trap states are shallower, the electric conductivity is higher.

The third is the process that the electrons 107 go over the barrier of the first insulating layer 102a by thermal excitation. The distribution of electrons existing in the semiconductor layer 101 follows the Fermi-Dirac distribution: in general, the proportion of electrons having high energy is larger as the temperature is higher. Assuming that the density of electrons having energy 3 eV higher than the Fermi level at 300 K (27° C.) is 1, for example, the density is $6\times10^{16}$ at 450 K (177° C.), $1.5\times10^{25}$ at 600 K (327° C.), and $1.6\times10^{30}$ at 750 K (477° C.).

The movement of the electrons 107 toward the gate electrode 103 by going over the barrier of the first insulating layer 102a occurs by the above three processes or the combination of these processes. In particular, the second and the third processes indicate that current increases exponentially as the temperature is higher.

Also, the Fowler-Nordheim tunnel effect is more likely to occur as the density of electrons in a thin part (a high-energy portion) of a barrier layer of the first insulating layer 102a is higher; thus, a higher temperature is better.

Note that in most cases, current generated by the conduction mechanism is weak in particular when the potential difference between the gate electrode 103 and the semiconductor layer 101 is small (5 V or lower). However, by taking a long time for the process, the needed number of electrons can be trapped by the electron trap states 106. As a result, the charge trap layer 102 is negatively charged.

In other words, the potential of the gate electrode 103 is kept higher than that of the source or drain electrode at a high temperature (a temperature higher than the operating temperature or the storage temperature of the semiconductor device, or higher than or equal to 125° C. and lower than or equal to 450° C. for example higher than or equal to 150° C. and lower than or equal to 300° C.) for one second or longer, for example, one minute or longer. As a result, the needed number of electrons moves from the semiconductor layer 101 toward the gate electrode 103 and some of them are trapped by the electron trap states 106. The temperature of the process for trapping electrons is referred to as process temperature below.

Here, the amount of electrons trapped by the electron trap states 106 can be controlled by the potential of the gate electrode 103. When a certain number of electrons is trapped by the electron trap states 106, due to the electric charge, the electric field of the gate electrode 103 is blocked and a channel formed in the semiconductor layer 101 disappears.

The total number of electrons trapped by the electron trap states 106 increases linearly at first, and then, the rate of increase gradually decreases, and the total number of electrons converges at a certain value. The convergence value depends on the potential of the gate electrode 103. As the potential is higher, the number of trapped electrons is more likely to be large; however, it never exceeds the total number of electron trap states 106.

The electrons trapped by the electron trap states 106 are required not to transfer from the charge trap layer 102 to the other regions. For this, each thickness of the first and second insulating layers 102a and 102b is preferably set at a thickness at which the tunnel effect is not a problem. For example, the physical thickness is preferably more than 1 nm.

However, electron transfer is hindered if the thickness of the first insulating layer 102a is too large; thus, 30 nm or less is preferable. Furthermore, if the thickness of the first and second insulating layers 102a and 102b is too large as compared with the channel length of the semiconductor device, the subthreshold value is increased to degrade the off-state characteristics. For this reason, the channel length is more than or equal to four times, typically more than or equal to ten times as large as the equivalent silicon oxide thickness of the first and second insulating layers 102a and 102b. Note that when a so-called High-K material is used, the equivalent silicon oxide thickness is less than the physical thickness.

The thickness of the first insulating layer 102a is preferably more than or equal to 10 nm and less than or equal to 20 nm, and the equivalent silicon oxide thickness of the second insulating layer 102b is more than or equal to 1 nm and less than or equal to 25 nm.

Another method is to set the operating temperature or the storage temperature of the semiconductor device at a temperature that is lower enough than the process temperature. For example, the process temperature is set at 300° C., and the semiconductor device is stored at 120° C. or lower. The probability that electrons go over a 3 eV-barrier when the temperature is 120° C. is less than a one hundred-thousandth that when the temperature is 300° C. In this way, although electrons easily go over a barrier to be trapped by the electron trap states 106 during the process at 300° C., the electrons are difficult to go over the barrier during storage at 120° C. and are kept trapped by the electron trap states 106 for a long time.

It is also effective that the effective mass of a hole is extremely large or is substantially localized in the semiconductor layer 101. In this case, the injection of holes from the semiconductor layer 101 to the first and second insulating layers 102a and 102b does not occur and consequently a phenomenon in which electrons trapped by the electron trap states 106 bond to holes and disappear does not occur.

A material showing Poole-Frenkel conduction may be used for the second insulating layer 102b. The Poole-Frenkel conduction is, as described above, electron hopping conduction between defect states and the like in a material. A material including a large number of defect states or including deep defect states has low electric conductivity and consequently can hold electrons trapped by the electron trap states 106 for a long time.

Circuit design or material selection may be made so that no voltage at which electrons trapped in the first and second insulating layers 102a and 102b are released is applied. For example, in a material whose effective mass of holes is extremely large or is substantially localized, such as an In—Ga—Zn-based oxide semiconductor, a channel is formed when the potential of the gate electrode 103 is higher than that of the source or drain electrode; however, when the potential of the gate electrode 103 is lower than that of the source or drain electrode, the material shows characteristics similar to an insulator. In this case, the electric field between the gate electrode 103 and the semiconductor layer 101 is extremely small and consequently the Fowler-Nordheim tunnel effect or electron conduction according to the Poole-Frenkel conduction is significantly decreased.

To hold electrons trapped by electron trap states inside the second insulating layer 102b or at the interface with another insulating layer, it is effective that the charge trap layer 102 is formed using three insulating layers as illustrated in FIG. 1C, that the electron affinity of the third insulating layer 102c is smaller than that of the second insulating layer 102b, and that the bandgap of the third insulating layer 102c is larger than that of the second insulating layer 102b.

In this case, if the physical thickness of the third insulating layer 102c is large enough, electrons trapped by the electron trap states 106 can be held even when the second insulating layer 102b has a small thickness. As a material of the third insulating layer 102c, the same material as or a material similar to that of the first insulating layer 102a can be used. Alternatively, a material whose constituent elements are the same as those of the second insulating layer 102b but number of electron trap states is small enough may be used. The number (density) of electron trap states depends on the formation method.

Note that when the electrically insulated conductive layer 102d is surrounded by the insulator 102e as illustrated in FIG. 1D, electrons are trapped in the conductive layer 102d according to the above principle. FIGS. 3C and 3D illustrate the examples. In FIG. 3C, the potential of the gate electrode 103 is equal to that of the source or drain electrode.

FIG. 3D shows the state where the potential of the gate electrode 103 is higher than the potential of the source or drain electrode. Electrons that exist in the semiconductor layer 101 move toward the gate electrode 103 having a higher potential. Some of the electrons moving from the semiconductor layer 101 toward the gate electrode 103 are trapped in the conductive layer 102d. In other word, in the semiconductor device illustrated in FIG. 1D, the conductive layer 102d functions as the electron trap state 106 in the semiconductor device in FIG. 1B.

When the work function of the conductive layer 102d is large, an energy barrier to the insulator 102e is high and consequently the trapped electrons can be prevented from moving out from the conductive layer 102d.

In the above structure, each of the first to third insulating layers 102a to 102c may be composed of a plurality of insulating layers. A plurality of insulating layers containing the same constituting elements and formed by different formation methods may be used.

For example, when the first and second insulating layers 102a and 102b are formed using insulating layers composed of the same constituting elements (e.g., hafnium oxide), the first insulating layer 102a may be formed by a chemical vapor deposition (CVD) method such as a metal organic chemical vapor deposition (MOCVD) method, a metal chemical deposition method, an atomic layer deposition (ALD) method, or a plasma-enhanced chemical vapor deposition (PECVD) method, an evaporation method, a pulsed laser deposition (PLD) method, or the like, and the second insulating layer 102b may be formed by sputtering.

Note that the first and second insulating layers 102a and 102b may be formed by different CVD methods.

In general, an insulating layer formed by sputtering includes more defects and stronger electron trapping characteristics than an insulating layer formed by CVD. From this reason, the second insulating layer 102b may be formed by sputtering and the third insulating layer 102c may be formed by CVD when the second and third insulating layers 102b and 102c contain the same constituent elements.

When the second insulating layer 102b is formed using a plurality of insulating layers containing the same constituent elements, one insulating layer may be formed by sputtering and another insulating layer may be formed by CVD.

As described above, the threshold of a semiconductor device is increased by the trap of electrons in the charge trap layer 102. In particular, when the semiconductor layer 101 is formed using a wide bandgap material, a source-drain current (cut-off current, Icut) when the potential of the gate electrode 103 is equal to the potential of the source electrode can be significantly decreased.

For example, the Icut density (a current value per micrometer of a channel width) of an In—Ga—Zn-based oxide whose bandgap is 3.2 eV is 1 zA/μm ($1\times10^{-21}$ A/μm) or less, typically 1 yA/μm ($1\times10^{-24}$ A/μm) or less.

Figure 4A:
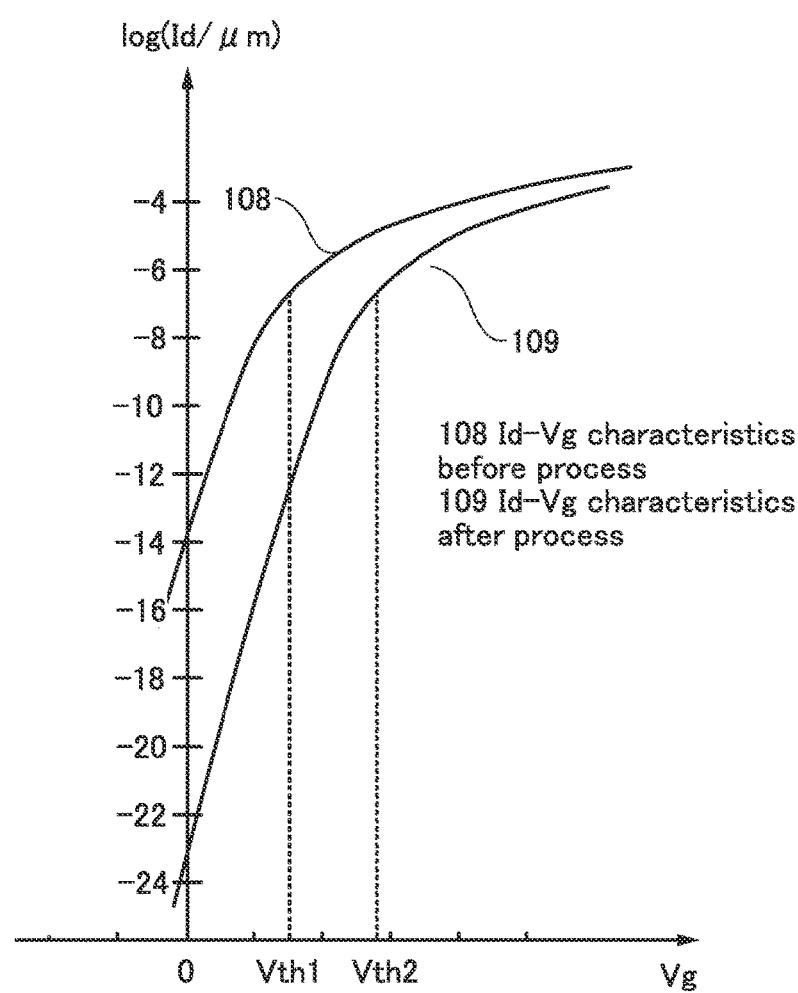
FIG. 4A schematically shows characteristics of a semiconductor device of an embodiment and FIG. 4B illustrates an example of a circuit in which the semiconductor device is used.

FIG. 4A schematically shows dependence of current per micrometer of channel width (Id) between source and drain electrodes on the potential of the gate electrode 103 (Vg) at room temperature, before and after electron trap in the electron trap layer 102. Note that each potential of the source electrode is 0 V and the potential of the drain electrode is +1 V. Although current smaller than 1 fA cannot be measured directly, it can be estimated from a value measured by another method, the subthreshold value, and the like.

As indicated by a curve 108, the threshold of the semiconductor device is Vth1 at first. After electron trapping, the threshold is increased (shifts in the positive direction) to become Vth2. As a result, Icut per micrometer of a channel width becomes 1 aA/μm ($1\times10^{-18}$ A/μm) or less, for example, greater than or equal to 1 zA/μm and less than or equal to 1 yA/μm.

Figure 4B:
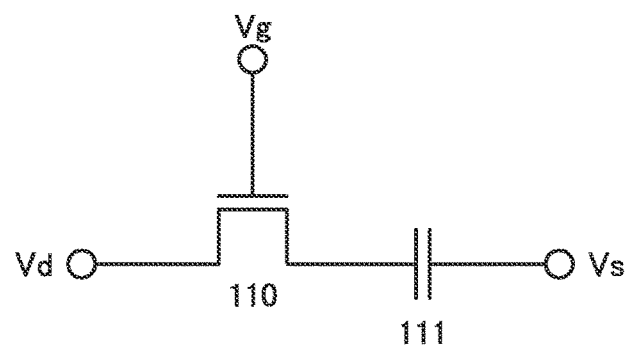

FIG. 4B illustrates a circuit in which charge stored in a capacitor 111 is controlled by a transistor 110. Leakage current between electrodes of the capacitor 111 is ignored. The capacitance of the capacitor 111 is 1 fF, the potential of the capacitor 111 on the transistor 110 side is +1 V, and the potential of Vd is 0 V.

The curve 108 in FIG. 4A denotes the Id-Vd characteristics of the transistor 110 and the channel width is 0.1 m, in which case the Icut is approximately 1 fA and the resistivity of the transistor 110 at this time is approximately $1\times10^{15}$ Ω. Accordingly, the time constant of a circuit composed of the transistor 110 and the capacitor 111 is approximately one second. This means that most of the charge stored in the capacitor 111 is lost in approximately one second.

The curve 109 in FIG. 4A denotes the Id-Vd characteristics of the transistor 110 and the channel width is 0.1 μm, in which case the Icut is approximately 1 yA and the resistivity of the transistor 110 at this time is approximately $1\times10^{24}$ Ω. Accordingly, the time constant of the circuit composed of the transistor 110 and the capacitor 111 is approximately $1\times10^{9}$ seconds (=approximately 31 years). This means that one-third of the charge stored in the capacitor 111 is left after 10 years.

From this, charge can be held for 10 years in a simple circuit composed of a transistor and a capacitor. This can be applied to various kinds of memory devices.

The range of the threshold increase depends on the density of electrons trapped by the charge trap layer 102. For example, in the semiconductor device illustrated in FIG. 1B, in the case where electrons are trapped only at the interface between the first insulating layer 102a and the second insulating layer 102b, the threshold is increased by Q/C, where Q is the surface density of trapped electrons and C is the dielectric constant of the first insulating layer 102a.

As described above, the potential of the gate electrode 103 determines the value at which the number of trapped electrons converges. Accordingly, the degree of the threshold increase can be adjusted by the potential of the gate electrode 103.

As an example, a case in which the potential of the gate electrode 103 is set higher than the potentials of the source electrode and the drain electrode by 1.5 V and the temperature is set at 150° C. to 250° C., typically 200° C.±20° C. is considered. Assuming that the threshold of the semiconductor device before electrons are trapped in the charge trap layer 102 (first threshold, Vth1) is +1.1 V, a channel is formed in the semiconductor layer 101 at first and electrons are trapped in the charge trap layer 102. Then, the number of trapped electrons in the charge trap layer 102 increases, and the channel disappears. At this stage, trap of electrons in the charge trap layer 102 stops.

In this case, because the channel disappears when the potential of the gate electrode 103 is higher than the potentials of the source electrode and the drain electrode by +1.5 V, the threshold voltage becomes +1.5 V. In other words, the threshold value is increased by 0.4 V owing to the electrons trapped in the charge trap layer 102. The threshold value changed by the electrons trapped in the charge trap layer 102 in the above manner is referred to as a second threshold value (Vth2). This process by which a threshold can be adjusted to an appropriate value is also referred to as threshold adjustment process.

By utilizing these characteristics, the thresholds of a plurality of semiconductor devices which are initially largely different from each other can converge at values within an appropriate range. For example, if three semiconductor devices with the first threshold voltages of +1.2 V, +1.1 V, and +0.9 V are subjected to the process under above-described conditions, trap of electrons does not make the threshold voltage to become significantly higher than +1.5 V in each semiconductor device; the second threshold voltage of each semiconductor device can become approximately +1.5 V. In this case, the number of trapped electrons in the charge trap layer 102 (e.g., the surface density of electrons) varies among the three semiconductor devices.

Note that the number of electrons trapped in the charge trap layer 102 also depends on the length of time for the threshold adjustment process and thus a desired threshold can be obtained by adjusting time for the threshold adjustment process.

Any of a variety of materials can be used for the gate electrode 103. For example, a conductive layer of Al, Ti, Cr, Co, Ni, Cu, Y, Zr, Mo, Ru, Ag, Ta, W, or the like can be used. The gate electrode 103 may have a stacked-layer structure of any of these materials. Alternatively, a conductive layer containing nitrogen may be used for the gate electrode 103. For example, a titanium nitride layer over which a tungsten layer is stacked, a tungsten nitride layer over which a tungsten layer is stacked, a tantalum nitride layer over which a tungsten layer is stacked, or the like can be used as the gate electrode 103.

Note that the work function of the gate electrode 103 that faces the semiconductor layer 101 is one factor determining the threshold of the semiconductor device; in general, as the work function of a material is smaller, the threshold becomes lower. However, as described above, the threshold can be adjusted by adjusting the number of trapped electrons in the charge trap layer 102; accordingly, the range of choices for the material of the gate electrode 103 can be widened.

Any of a variety of materials can be used for the semiconductor layer 101. For example, other than silicon, germanium, and silicon germanium, any of a variety of oxide semiconductors described later can be used.

Any of a variety of materials can be used for the first insulating layer 102a. For example, an insulating layer containing one or more kinds selected from magnesium oxide, silicon oxide, silicon oxynitride, silicon nitride oxide, silicon nitride, gallium oxide, germanium oxide, yttrium oxide, zirconium oxide, lanthanum oxide, neodymium oxide, and tantalum oxide can be used.

The second insulating layer 102b can be an insulating layer containing one or more kinds selected from hafnium oxide, aluminum oxide, tantalum oxide, aluminum silicate, silicon nitride, and the like, for example.

The third insulating layer 102c can be an insulating layer containing one or more kinds selected from magnesium oxide, silicon oxide, silicon oxynitride, silicon nitride oxide, silicon nitride, gallium oxide, germanium oxide, yttrium oxide, zirconium oxide, lanthanum oxide, neodymium oxide, and tantalum oxide, for example.

The conductive layer 102d can be formed using any kind of materials. For example, a conductive layer of Al, Ti, Cr, Co, Ni, Cu, Y, Zr, Mo, Ru, Ag, Ta, W, Pt, Pd, or the like can be used. The conductive layer 102d may have a stacked-layer structure of any of these materials. Alternatively, a conductive layer containing nitrogen may be used as the conductive layer 102d.

In particular, as a material having a large work function, a metal of the platinum group such as platinum or palladium: a nitride such as indium nitride, zinc nitride, In—Zn-based oxynitride, In—Ga-based oxynitride, or In—Ga—Zn-based oxynitride; or the like may be used.

Any of a variety of materials can be used for the insulator 102e. For example, silicon oxide, silicon nitride, silicon oxynitride, silicon nitride oxide, aluminum oxide, or tantalum oxide can be used.

Thus, the semiconductor device in which a necessary number of electrons are trapped in the charge trap layer 102 is the same as a normal MOS semiconductor device. When the semiconductor device is used as a MOS semiconductor device, it is preferable that the potential of the gate electrode 103 be always set at the lowest potential in the circuit.

The threshold corrected by the above method is determined by the potential difference between the semiconductor layer 101 and the gate electrode 103 during the process. Thus, the thresholds of a plurality of transistors can be appropriate values depending on the intended use of the transistors, by using different potential differences for the threshold adjustment process.

Figure 5A:
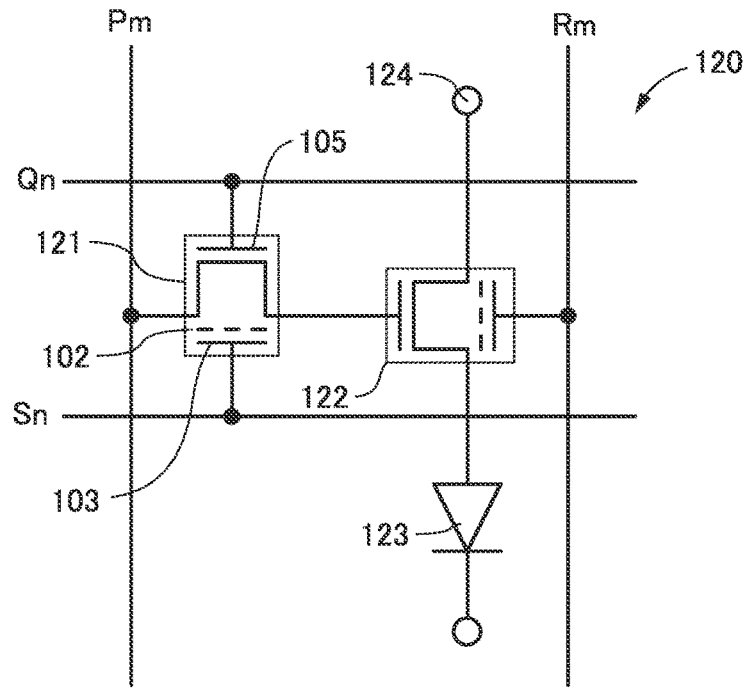
FIGS. 5A and 5B show an example of a display device of an embodiment.

A pixel 120 in FIG. 5A includes a transistor 121, a transistor 122, and a light-emitting element 123. Another transistor, a capacitor, or the like is also included as necessary. Each of the transistors 121 and 122 includes a charge trap layer 102. After a circuit is formed, the threshold is corrected in the above-described manner. Note that as shown in the drawing, a threshold-corrected transistor is represented by a symbol that is different from the symbol for a normal transistor to show that the threshold-corrected transistor contains electrons in the charge trap layer 102. In this example, a transistor including the gate electrodes 103 and 105 as in FIGS. 2A to 2C is used.

Here, the threshold of the transistor 121 is different from that of the transistor 122. For example, the off-state current of the transistor 121 is preferably smaller (the off-state resistance is higher) than that of the transistor 122, that is, the threshold of the transistor 121 is preferably larger than that of the transistor 122. This is because change in gate potential of the transistor 122 needs to be suppressed. The threshold of the transistor 122 is preferably less changed, but the off-state resistance of the transistor 122 does not need to be high. It is sometimes preferable that the threshold be smaller in view of suppressing potential change of a data line Pm (reducing power consumption). The potentials of the gate electrodes 103 in the transistors are thus different from each other in the threshold adjustment process.

The pixels 120 having the structure shown in FIG. 5A are arranged in a matrix display device. For example, the pixel 120 in the n-th row and the m-th column is connected to the data line Pm, a selection line Qn, a threshold correction line Rm, a threshold correction line Sn, and a power supply line 124. Note that the threshold correction line Rm and the threshold correction line Sn are at right angles to each other.

The threshold correction can be performed as follows. First, the potentials of the data line Pm and the power supply line 124 are set to 0 V. The potential of the selection line Qn may also be set to 0 V or may be held at an appropriate potential for an appropriate period so that the transistor 121 can be in an on state. Then, the potentials of the threshold correction line Rm and Sn are set to appropriate potentials and held for an appropriate period in appropriate temperatures. In this way, the threshold is corrected to an appropriate value.

Note that the thresholds of the transistors 121 and 122 before the threshold adjustment process may be 0 V or lower or may be values for making Icut flow appropriately. With such a transistor, the potential of the gate electrode 105 of the transistor 122 can be the same as the potential of the data line Pm even in the threshold adjustment process.

In order to make the threshold of the transistor 121 higher than the threshold of the transistor 122, the potential of the threshold correction line Sn during the threshold adjustment process is set higher than the potential of the threshold correction line Rm. For example, the potentials of the threshold correction lines Sn and Rm are +2 V and +1 V, respectively. The potentials of the threshold correction lines Sn and Rm may be +2 V and 0 V, respectively. In that case, the threshold of the transistor 122 does not change from the initial value.

Note that the threshold correction line Rm is not necessarily provided in the case where the threshold adjustment process for the transistor 122 is unnecessary. The threshold correction line Rm (or the corresponding line) may be provided even when the threshold adjustment process for the transistor 122 is not performed. In practical use, the threshold of the transistor 122 can be corrected by applying an appropriate potential to the threshold correction line Rm (or the corresponding line).

The potentials of the threshold correction lines Rm and Sn may be changed successively or gradually, and they may be changed independently or in synchronization with each other, for example. For example, in a first period, the potentials of the threshold correction lines Rm and Sn are set to +1 V. In the following second period, the potential of the threshold correction line Sn is changed to +2 V, but the potential of the threshold correction line Rm remains at +1 V. Here, the potential of the selection line Qn may be one by which the transistor 121 is turned on in the first period and may be changed to 0 V in the second period.

In this process, when the thresholds of the transistors 121 and 122 are both, for example, 0 V before the threshold adjustment process, the thresholds of the transistors 121 and 122 become +1 V or lower in the first period. In the second period, the threshold of the transistor 122 is less changed and variation in thresholds of the transistor 122 is small, whereas the threshold of the transistor 121 is increased to +2 V or lower.

Figure 5B:
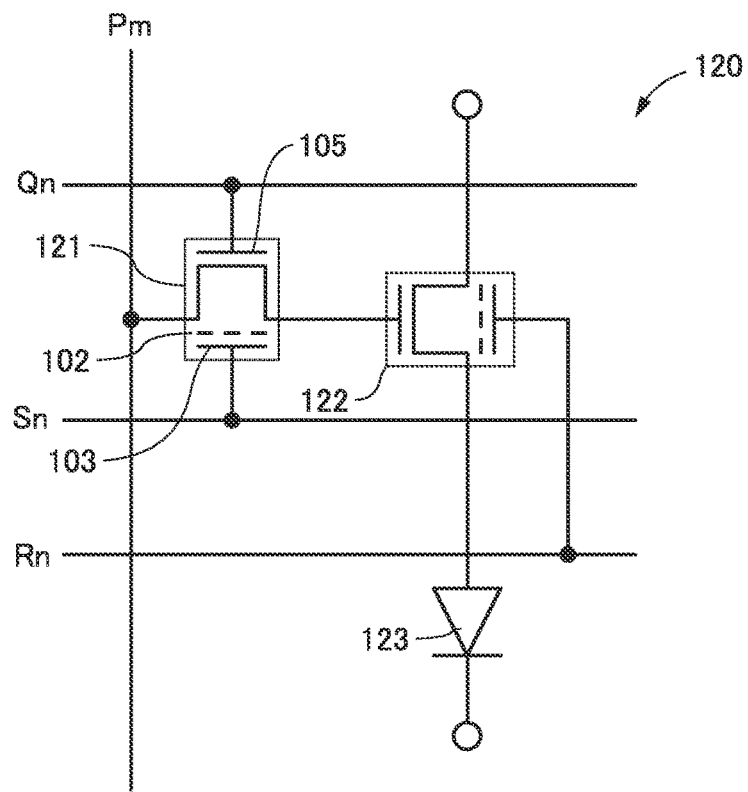

Note that a threshold correction line Rn may be parallel to the threshold correction line Sn as shown in FIG. 5B. In this case, the threshold correction method can be similar to that in the case of FIG. 5A.

When the threshold is adjusted to an appropriate value by making the charge trap layer trap electrons as described above, it is preferable to avoid further addition of electrons to the charge trap layer in normal use after that. For example, further addition of electrons means a further increase of threshold, resulting in circuit deterioration.

When a charge trap layer is in the vicinity of a semiconductor layer and a wiring or an electrode facing the semiconductor layer and having a potential higher than that of the semiconductor layer exists, there is a possibility that electrons are trapped by the charge trap layer also in normal use.

In the pixel 120 shown in FIG. 5A or 5B, for example, this problem can be solved by setting the potential of the threshold correction line Rm and the like to lower than or equal to the lowest potential of the data line Pm after the threshold adjustment process.

Figure 6A:
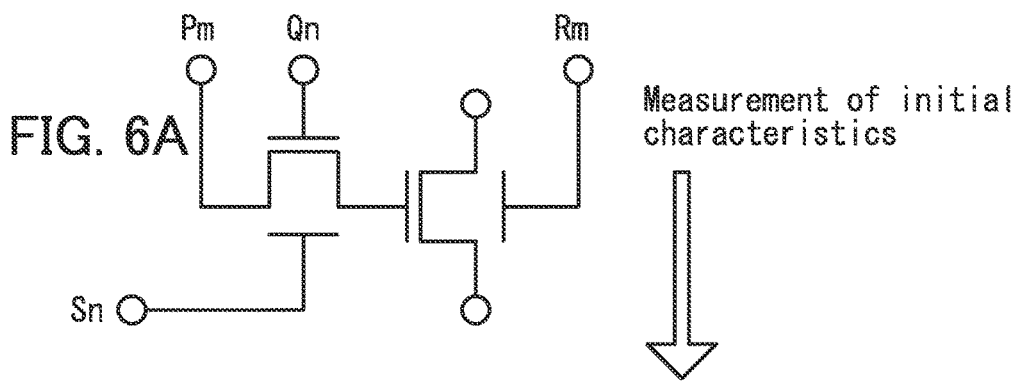
FIGS. 6A to 6C show an example of a manufacturing process of a semiconductor device.
Figure 6B:
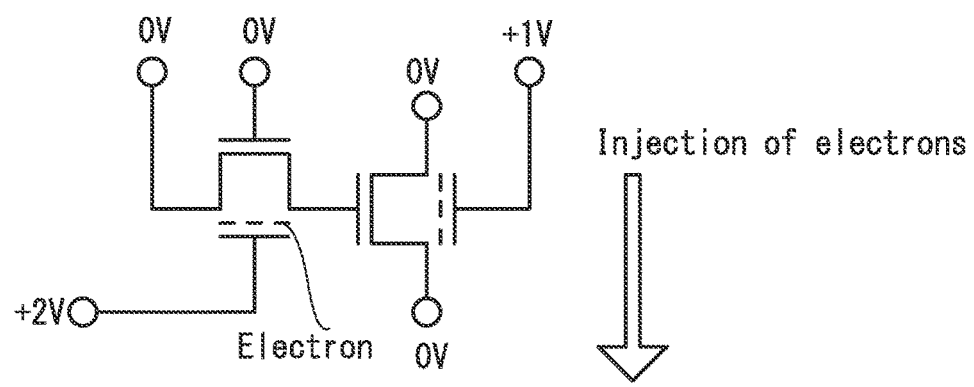
Figure 6C:
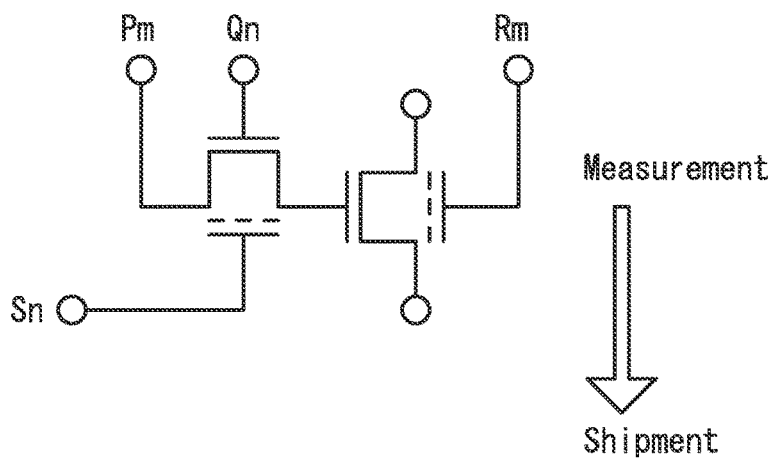

For example, steps illustrated in FIGS. 6A to 6C can be performed. First, as illustrated in FIG. 6A, initial characteristics of finished display devices are measured to select conforming items. Here, it is preferable that items without malfunctions that is caused by disconnection or the like and cannot be recovered be regarded as conforming items. Threshold anomalies are not the criterion for selection because thresholds have not been corrected yet.

Electrons are then injected as in FIG. 6B. An appropriate number of electrons are trapped in the charge trap layer 102. This operation is performed in the above-described manner.

Then, measurement is performed again as in FIG. 6C. One criterion for conforming items is that the threshold is corrected as planned. At this stage, display devices with threshold anomalies may be regarded as nonconforming items and may again be subjected to electron injection. Conforming items are shipped.

The process for trapping electrons in the charge trap layer 102 is not limited to the above, and it is preferable that the display device be not exposed to temperatures of 125° C. or higher for one hour or more after the process.

Note that particularly in the semiconductor device having any of the structures of FIGS. 2A to 2C, any potential can be used as the potential applied to the gate electrode 103 as long as the threshold adjustment process is not performed in normal use and is performed one time before shipment from the factory, for example. A potential which is not usually used can be used, for example.

For example, even when the thickness of the third insulating layer 102c is considerably larger than those of the first insulating layer 102a and the second insulating layer 102b in the semiconductor device in FIG. 2C, the second insulating layer 102b can trap electrons by application of an appropriate potential to the gate electrode 103. The thickness of the third insulating layer 102c may be increased so that the thickness of the charge trap layer 102 is 500 nm or more, for example.

Assume that when the equivalent silicon oxide thicknesses of the first to third insulating layers 102a to 102c are each 10 nm, for example, the threshold adjustment process is performed under the potential difference between the gate electrode 103 and the semiconductor layer 101 being 1.5 V. When the same threshold adjustment process is performed with the first and second insulating layers 102a and 102b each having an equivalent silicon oxide thickness of 10 nm and the third insulating layer 102c having an equivalent silicon oxide thickness of 1 μm, the potential difference between the gate electrode 103 and the semiconductor layer 101 is set at 150 V.

This example of including a plurality of transistors with different thresholds in one device can be employed in other devices without limitation to the above. Instead of the light-emitting element 123, an electron emitter, a liquid crystal element, electronic ink, an electrophoretic element, a grating light valve (GLV), a plasma display panel (PDP), a micro electro mechanical system (MEMS), a digital micromirror device (DMD), a digital micro shutter (DMS), an interferometric modulator display (IMOD) element, an electrowetting element, a piezo-ceramic element, or a carbon nanotube, which are display media whose contrast, luminance, reflectivity, transmittance, or the like is changed by electromagnetic action, may be used.

Figure 7A:
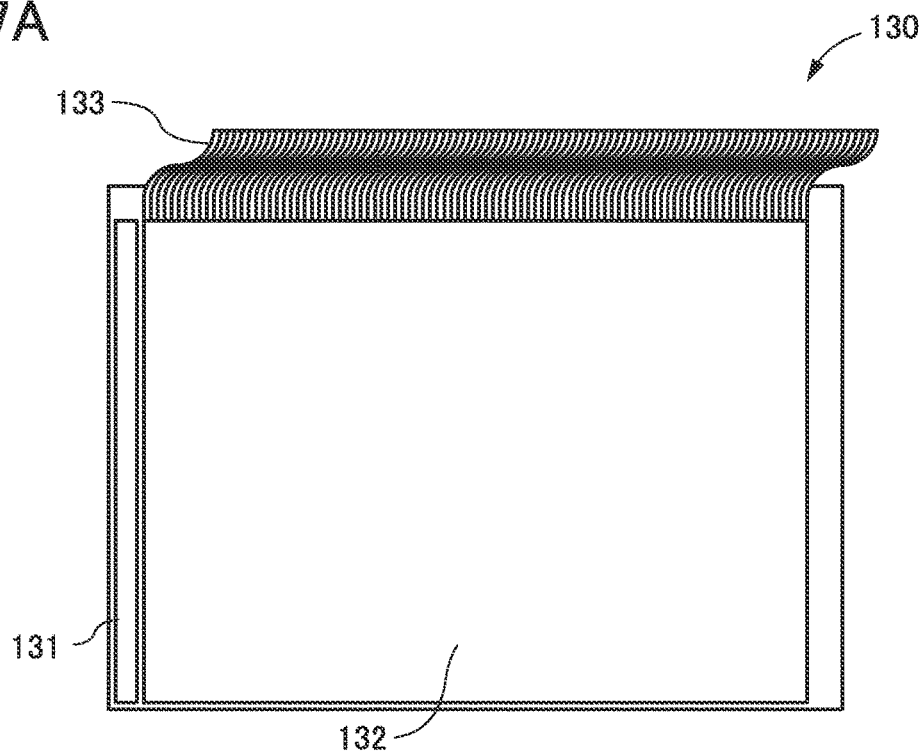
FIGS. 7A and 7B show examples of a display device of an embodiment and a microprocessor of an embodiment, respectively.

FIG. 7A schematically shows a display device 130. The display device 130 includes a driver region 131, a display region 132, an external connection terminal (e.g., an FPC 133), and the like. When the display device 130 is of an active matrix type, for example, thin film transistors are used in the driver region 131 and the display region 132.

Here, for example, the threshold of the thin film transistor used in the driver region 131 may be higher than that of the thin film transistor in the display region 132. In that case, time and voltage of the threshold adjustment process are preferably different between the driver region 131 and the display region 132. The threshold adjustment process may be performed on only thin film transistors used in the driver region 131, without being performed on thin film transistors used in the display region 132. The opposite is possible.

Figure 7B:
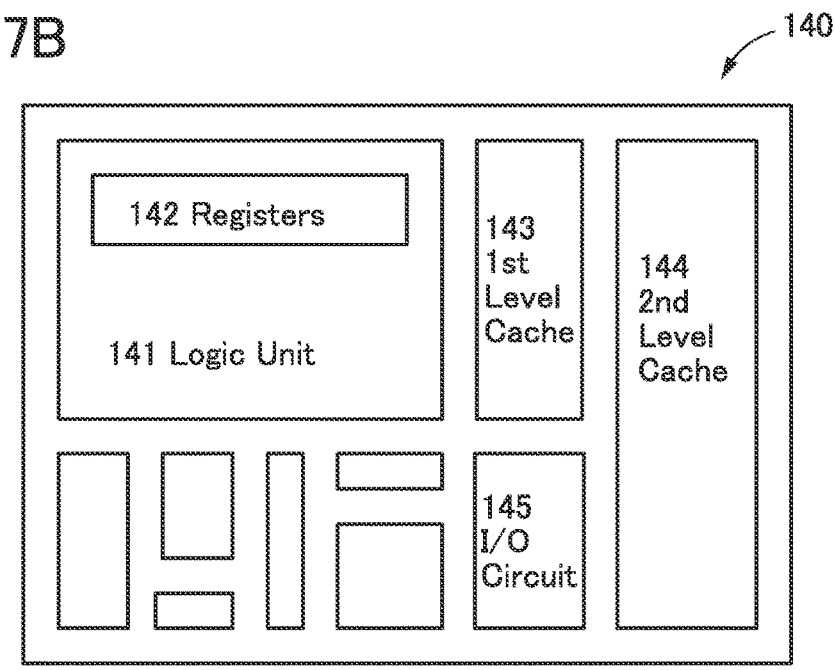

FIG. 7B is an example of a microprocessor 140. The microprocessor 140 includes a logical unit 141 (including registers 142), a first level cache 143, a second level cache 144, an I/O circuit 145, and the like. A memory device including the circuit shown in FIG. 4B can be used as a memory device used for the registers 142, the first level cache 143, the second level cache 144, and the like.

Figure 8A:
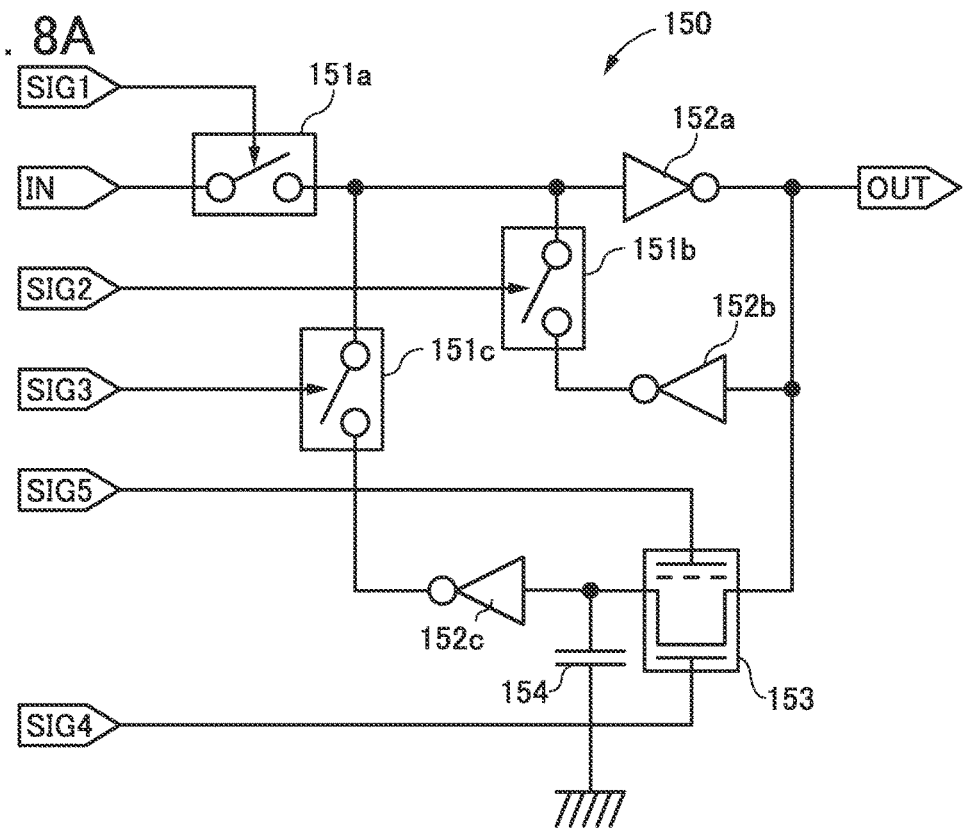
FIGS. 8A and 8B show examples of a memory element of an embodiment.

FIG. 8A is an example of a memory element 150 used in the registers 142. The memory element 150 includes a switch 151a, a switch 151b, a switch 151c, an inverter 152a, an inverter 152b, an inverter 152c, a transistor 153 having a structure similar to FIG. 2A, and a capacitor 154. The transistor 153 is a threshold-corrected transistor.

An example of the threshold correction is as follows: a state where other than the potential of the signal SIG5 such as the potentials of signals IN, OUT, SIG1, SIG2, SIG3, and SIG4 and the power supply potentials of the inverters 152a to 152c are all the same (first potential), but only the potential of a signal SIG5 is an appropriate potential (second potential) higher than the first potential is kept at higher than or equal to 150° C. and lower than or equal to 300° C. An appropriate amount of electrons are then trapped in the charge trap layer of the transistor 153 to adjust the threshold.

In a normal operation, data is held by the inverters 152a and 152b (output of one is connected to input of the other) while power is supplied from outside to the memory element 150. Since the inverters 152a and 152b consume power, the power supply may be stopped to reduce power consumption as needed. In that case, data (charge) is saved to the capacitor 154 and then the transistor 153 is turned off. Power might be off for a maximum of a few seconds to a few years, and the off-state resistance of the transistor 153 needs to be sufficiently high (i.e., the threshold needs to be high).

Figure 8B:
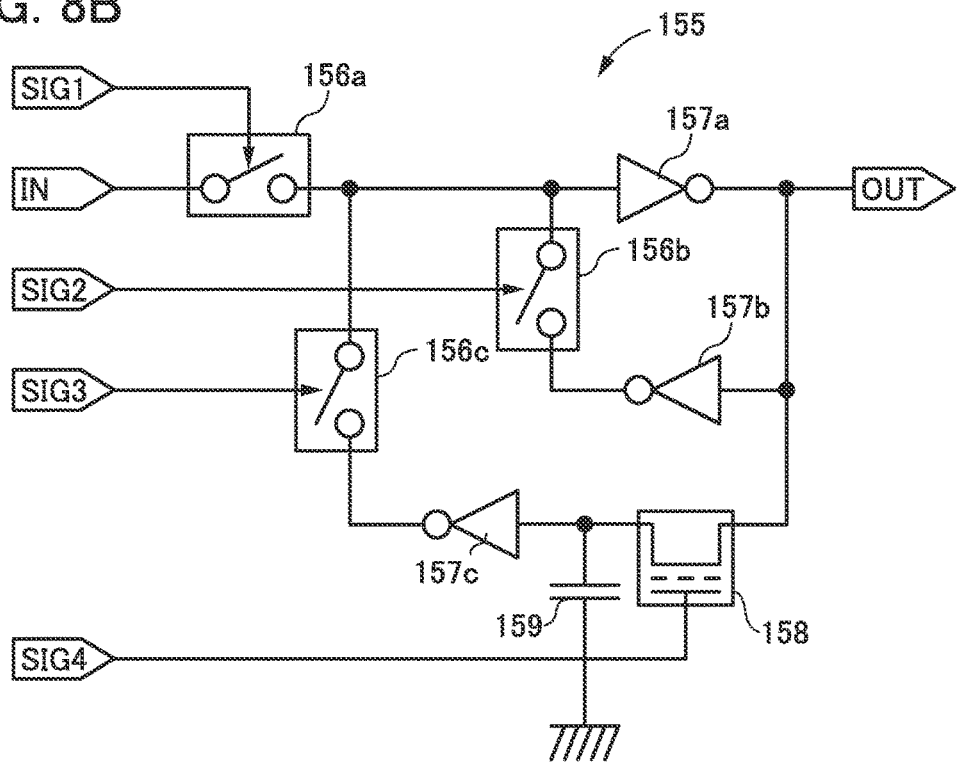

The above is an example in which a semiconductor device having the structure of FIG. 2A is used. Alternatively, a semiconductor device having a structure of FIG. 1A may be used. FIG. 8B is an example of a memory element 155 using a semiconductor device having the structure of FIG. 1A. The memory element 155 includes a switch 156a, a switch 156b, a switch 156c, an inverter 157a, an inverter 157b, an inverter 157c, a transistor 158 having a structure similar to FIG. 1A, and a capacitor 159. The transistor 158 is a threshold-corrected transistor.

An example of the threshold correction is as follows: a state where other than the potentials of the signal SIG4 such as the potentials of the signals IN, OUT, SIG1, SIG2, and SIG3, the power supply potentials of the inverters 157a to 157c are all the same (first potential), but only the potential of the signal SIG4 is an appropriate potential (second potential) higher than the first potential is kept at higher than or equal to 150° C. and lower than or equal to 300° C. An appropriate amount of electrons are then trapped in the charge trap layer of the transistor 158 to adjust the threshold.

Figure 9A:
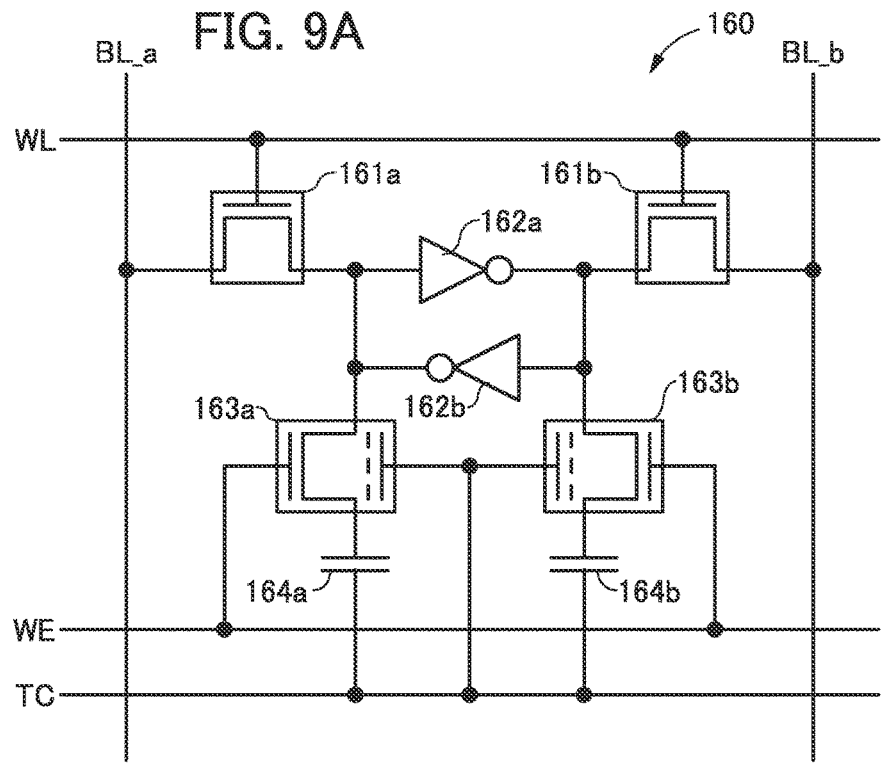
FIGS. 9A and 9B show examples of a memory element of an embodiment.

FIG. 9A is an example of the memory element 160 used in the first level cache 143. The memory element 160 includes a transistor 161a, a transistor 161b, an inverter 162a, an inverter 162b, transistors 163a and 163b each having a structure similar to FIG. 2A, and capacitors 164a and 164b. The transistors 163a and 163b are threshold-corrected transistors.

An example of the threshold correction is as follows: a state where other than the potential of a threshold correction line TC such as the potentials of a bit line BL_a, a bit line BL_b, a word line WL, a backup control line WE, the power supply potentials of inverters 162a and 162b are all the same (first potential), but only the potential of the threshold correction line TC is an appropriate potential (second potential) higher than the first potential is kept at higher than or equal to 150° C. and lower than or equal to 300° C. An appropriate amount of electrons are then trapped in the charge trap layers of the transistors 163a and 163b to adjust the thresholds.

Note that the potential of the threshold correction line TC is fixed in a normal use at the lowest one in the circuit, for example. It is thus possible to connect the threshold correction line TC with the capacitors 164a and 164b, for example.

In a normal operation, data is held by the inverters 162a and 162b (output of one is connected to input of the other) while power is supplied from outside to the memory element 160. Since the inverters 162a and 162b consume power, the power supply may be stopped to reduce power consumption as needed. In that case, data (charge) is saved to the capacitors 164a and 164b and then the transistors 163a and 163b are turned off. Power might be off for a maximum of a few seconds to a few years, and the off-state resistance of the transistors 163a and 163b needs to be sufficiently high (i.e., the threshold needs to be high).

Figure 9B:
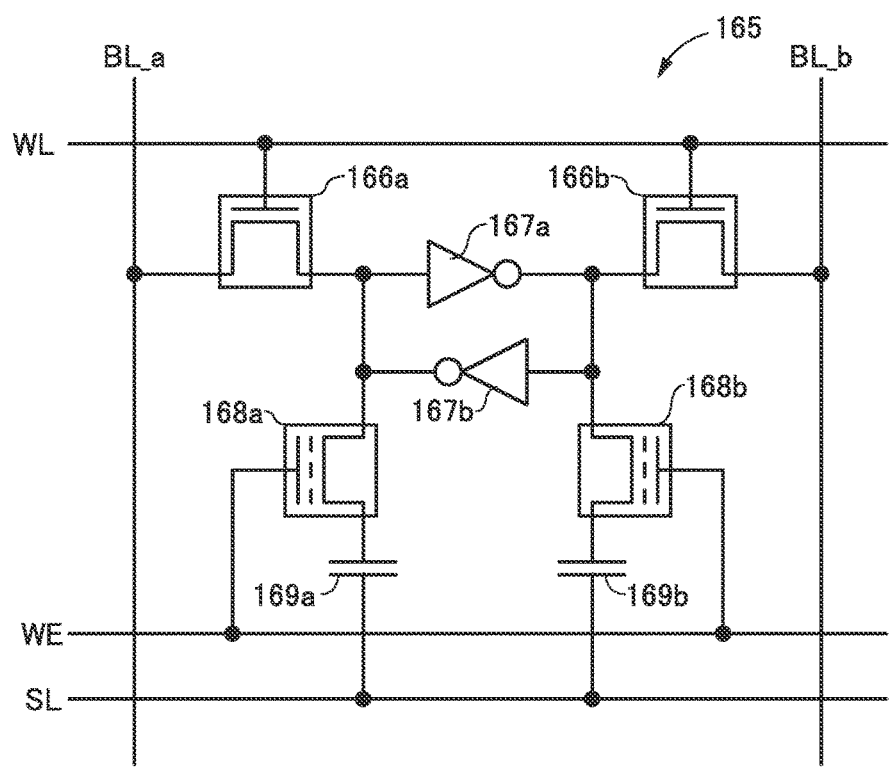

The above is an example in which a semiconductor device having a structure of FIG. 2A is used, and alternatively, a semiconductor device having a structure of FIG. 1A may be used. FIG. 9B is an example of a memory element 165 using a semiconductor device having a structure of FIG. 1A. The memory element 165 includes a transistor 166a, a transistor 166b, an inverter 167a, an inverter 167b, transistors 168a and 168b each having a structure similar to FIG. 1A, and capacitors 169a and 169b. The transistors 168a and 168b are threshold-corrected transistors.

An example of the threshold correction is as follows: a state where other than the potential of the backup control line WE such as the potentials of the bit line BL_a, the bit line BL_b, the word line WL, the power supply potentials of the inverters 167a and 167b are all the same (first potential), but only the potential of the backup control line WE is an appropriate potential (second potential) higher than the first potential is kept at higher than or equal to 150° C. and lower than or equal to 300° C. An appropriate amount of electrons are then trapped in the charge trap layers of the transistors 168a and 168b to adjust the thresholds.

Figure 10A:
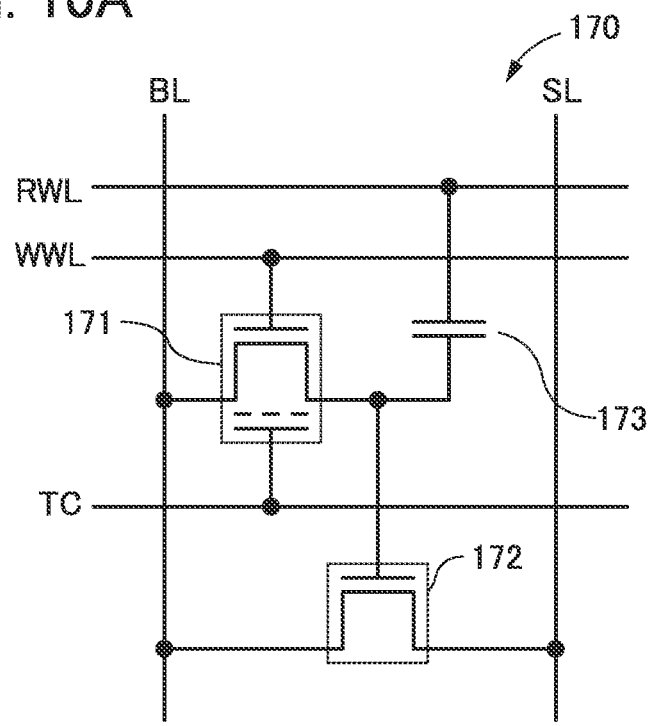
FIGS. 10A and 10B show examples of a memory element of an embodiment.

FIG. 10A is an example of a memory element 170 used for the first level cache 143 or the second level cache 144. The memory element 170 includes a transistor 171, a transistor 172, and a capacitor 173. The transistor 171 is a threshold-corrected transistor having a structure similar to that in FIG. 2A.

An example of the threshold correction is as follows: a state where other than the potential of the threshold correction line TC such as the potentials of the bit line BL, a write word line WWL, a read word line RWL are all the same (first potential), but only the potential of the threshold correction line TC is an appropriate potential (second potential) higher than the first potential is kept at higher than or equal to 150° C. and lower than or equal to 300° C. An appropriate amount of electrons are then trapped in the charge trap layer of the transistor 171 to adjust the threshold.

Figure 10B:
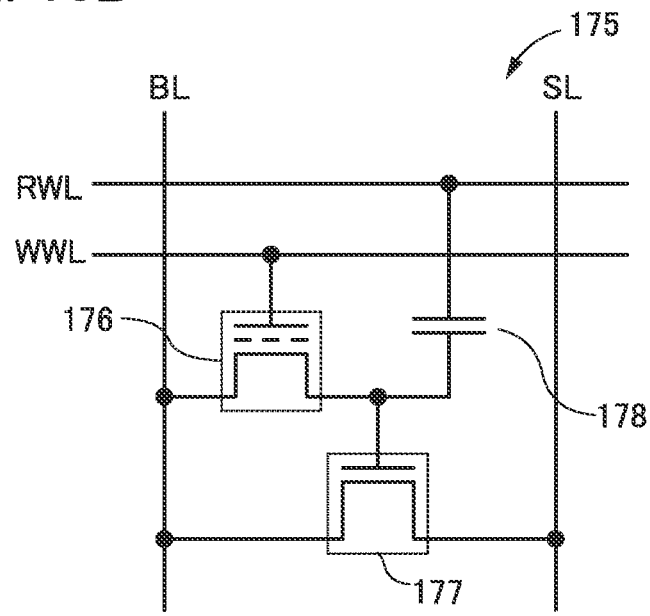

The above is an example in which a semiconductor device having a structure of FIG. 2A is used, and alternatively, a semiconductor device having a structure of FIG. 1A may be used. FIG. 10B is an example of a memory element 175 using a semiconductor device having a structure of FIG. A. The memory element 175 includes a transistor 176, a transistor 177, and a capacitor 178. The transistor 176 is a threshold-corrected transistor having a structure similar to FIG. 1A.

An example of the threshold correction is as follows: a state where other than the potential of a write word line WWL such as the potentials of the bit line BL, the read word line RWL are all the same (first potential), but only the potential of the write word line WWL is an appropriate potential (second potential) higher than the first potential is kept at higher than or equal to 150° C. and lower than or equal to 300° C. An appropriate number of electrons are then trapped in the charge trap layer of the transistor 176 to adjust the threshold.

Figure 11A:
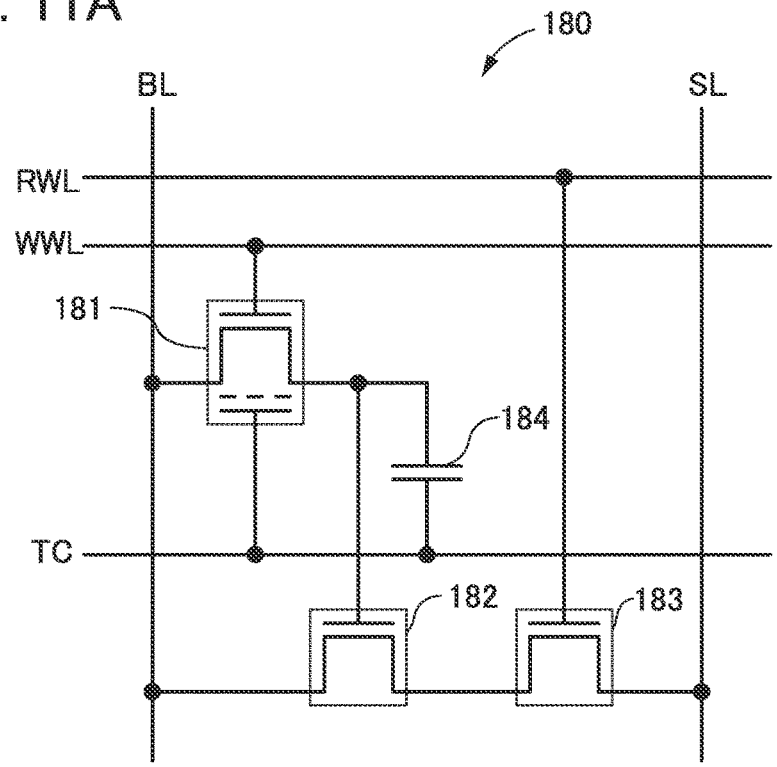
FIGS. 11A and 11B show examples of a memory element of an embodiment.

FIG. 11A is an example of a memory element 180 used for the first level cache 143 or the second level cache 144. The memory element 180 includes a transistor 181, a transistor 182, a transistor 183, and a capacitor 184. The transistor 181 is a threshold-corrected transistor having a similar structure as FIG. 2A. The threshold correction is preferably performed as that for the transistor 171 of the memory element 170 is performed. Note that the potential of the threshold correction line TC is fixed in a normal use at the lowest one in the circuit, for example. It is thus possible to connect the threshold correction line TC with the capacitor 184, for example.

Figure 11B:
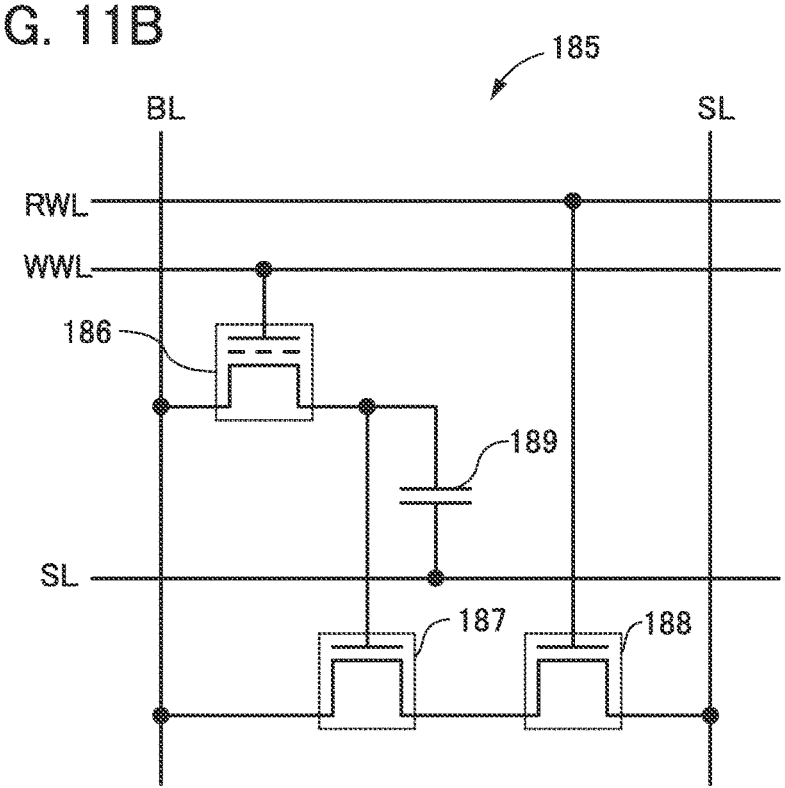

The above is an example in which a semiconductor device having a structure of FIG. 2A is used, and alternatively, a semiconductor device having a structure of FIG. 1A may be used. FIG. 11B is an example of a memory element 185 using a semiconductor device having a structure of FIG. A. The memory element 185 includes a transistor 186, a transistor 187, a transistor 188, and a capacitor 189. Although the capacitor 189 is connected to the source line SL, the capacitor 189 may be connected to other wirings. The transistor 186 is a threshold-corrected transistor having a similar structure as FIG. 1A. The threshold correction is preferably performed as that for the transistor 176 of the memory element 175 is performed.

Because the memory element 170 stores data using the charge held by the capacitor 173, the transistor 171 needs to have high off-state resistance. The memory element 170 needs to respond at suitable high speed, and the transistor 171 also needs to have low on-state resistance. The charge hold period of the capacitor 173 used in a cache is one minute or shorter, and the threshold of the transistor 171 is thus determined so that the memory element 170 can hold data for about one minute. This is also applied to the memory elements 175, 180, and 185.

Although the transistors 153, 163a, 163b, 171, and 181 in the memory elements 150, 160, 170, and 180 have the same function of holding charge in the capacitors 154, 164a, 164b. 173, and 184, the charge hold periods are different from one another and thus the thresholds need to be different.

In most cases, the transistors 153, 163a, 163b, 171, and 181 are formed in the same microprocessor 140 to have the same layer structure. It is preferable to adjust the threshold of each of these transistors by changing conditions of the threshold adjustment process. Here, their threshold correction lines or the like are preferably configured to have different potentials from one another for the same period or for different periods.

The same is applied to the transistors 158, 168a, 168b, 176, and 186 used in the memory elements 155, 165, 175, and 185.

Note that threshold correction is not necessarily performed on all of the transistors 153, 158, 163a, 163b, 168a, 168b, 171, 176, 181, and 186. For example, threshold correction is not performed on the transistors 171, 176, 181, and 186 but is performed on all or some of the transistors 153, 158, 163a, 163b, 168a, and 168b.

Figure 12A:
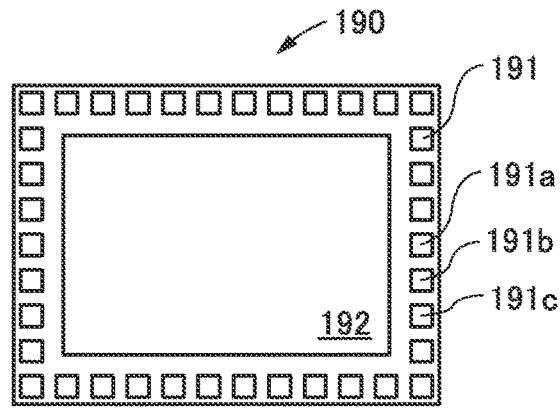
FIGS. 12A to 12C illustrate examples of a manufacturing process of a semiconductor device.

FIG. 12A is an example of a semiconductor chip 190 including the microprocessor 140 as in FIG. 7B. The semiconductor chip 190 includes a plurality of pads 191 and a device region 192. When a plurality of semiconductor devices having the structure of FIG. 2A is included, for example, a threshold correction line which is connected to the gate electrode 103 can be individually provided.

For example, the signal SIG5 for correcting the threshold of the transistor 153 in the memory element 150 is input from a pad 191a, the threshold correction line TC of the memory element 160 is connected to a pad 191b, and the threshold correction line TC of the memory element 170 is connected to a pad 191c. When different potentials are applied to the pads 191a, 191b, and 191c or appropriate potentials are applied to all or some of the other pads, the thresholds of transistors in memory elements are different from one another.

An example of the threshold adjustment process is as follows: the semiconductor chip 190 is heated to 150° C. to 300° C., and a state where the potentials of the pads 191a, 191b, and 191c are +1.5 V, +1.2 V, and +1.0 V, respectively, and the potentials of the other pads 191 is all 0 V is kept for longer than or equal to one minute and shorter than or equal to one hour.

Another example of the threshold adjustment process is as follows: a state where the semiconductor chip 190 is heated to 150° C. to 300° C., the potentials of the pads 191a, 191b, and 191c are +1.0 V, and the potentials of the other pads 191 are all 0 V is kept for longer than or equal to one minute and shorter than or equal to one hour; then, a state where the potentials of the pads 191a, 191b, and 191c are +1.5 V, +1.2 V, +1.0 V, respectively, and the potentials of the other pads 191 are all 0 V is kept for longer than or equal to one minute and shorter than or equal to one hour.

Another example of the threshold adjustment process is as follows: a state where the semiconductor chip 190 is heated to 150° C. to 300° C., the potentials of the pads 191a. 191b, and 191c are +1.5 V, +1.2 V, +1.0 V, respectively, and the potentials of the other pads 191 are all 0 V is kept for longer than or equal to one minute and shorter than or equal to one hour; then, a state where the potential of the pad 191c is +1.0 V and the potentials of the other pads 191 (including the pads 191a and 191b) are all 0 V is kept for longer than or equal to one minute and shorter than or equal to one hour.

Note that thresholds of transistors after the threshold adjustment process are different, but the transistors have substantially the same thermal history.

Figure 12B:
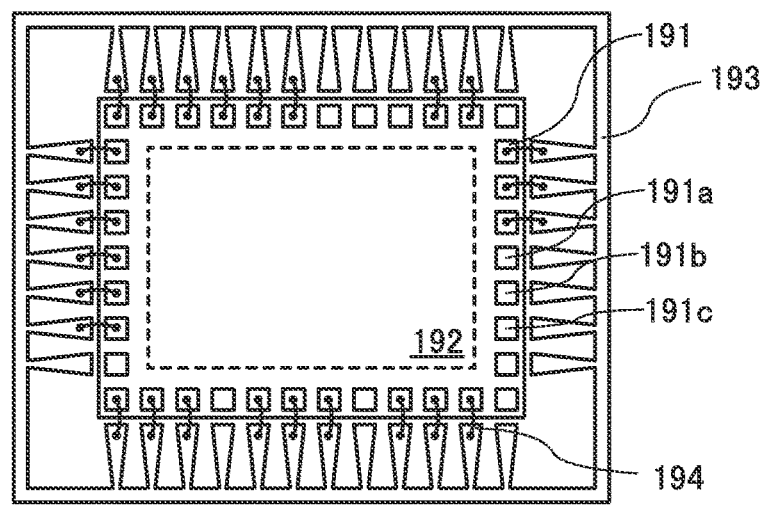

The timing of the threshold adjustment process is not limited to the above. For example, the process may be performed after a lead frame 193 is connected to the pads 191 by bonding wirings 194 as shown in FIG. 12B.

Here, for example, only the pads 191a, 191b, and 191c are not connected to the lead frame 193, and all the pads need to be connected to the outside are connected to the lead frame 193. Here, the potentials of the lead frame 193, the pads 191a, 191b, and 191c are 0 V, +1.5 V, +1.2 V, and +1.0 V, for example, which are appropriate potentials for threshold correction, to perform the threshold adjustment process.

Figure 12C:
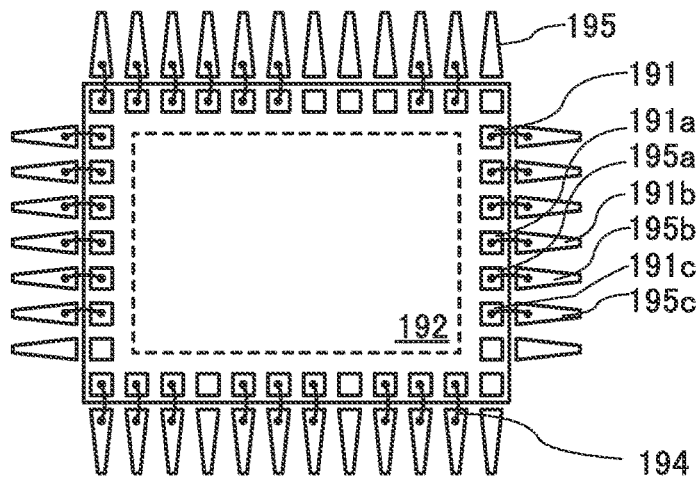

Furthermore, the threshold adjustment process can be performed in the state shown in FIG. 12C where the lead frame 193 is divided into a plurality of leads 195 each of which are connected to the semiconductor chip. Here, all or some of the leads 195 is connected to all or part of the pads 191 by the bonding wirings 194. Leads 195a, 195b, and 195c are connected to the pads 191a, 191b, and 191c, respectively by the bonding wirings 194.

Here, the potentials of the leads 195a, 195b, and 195c are +1.5 V, +1.2 V, and +1.0 V, respectively, and all or some of the other leads 195 are 0 V for example, to perform the threshold adjustment process.

Then, the semiconductor chip 190 is packaged. Note that the threshold adjustment process can be performed even after the packaging in consideration of heat resistance of the package material.

In the above example, thresholds are corrected by making the charge trap layer 102 trap electrons. Alternatively, thresholds can be corrected by making the charge trap layer 102 trap holes.

Embodiment 2

In this embodiment, a semiconductor device which can be used for the transistor and the like described in Embodiment 1 will be described with reference to the drawing. Although a transistor in which a threshold correction gate electrode exists between a substrate and a semiconductor layer is described below, a transistor in which a semiconductor layer exists between a threshold correction gate electrode and a substrate may be used.

Figure 13A:
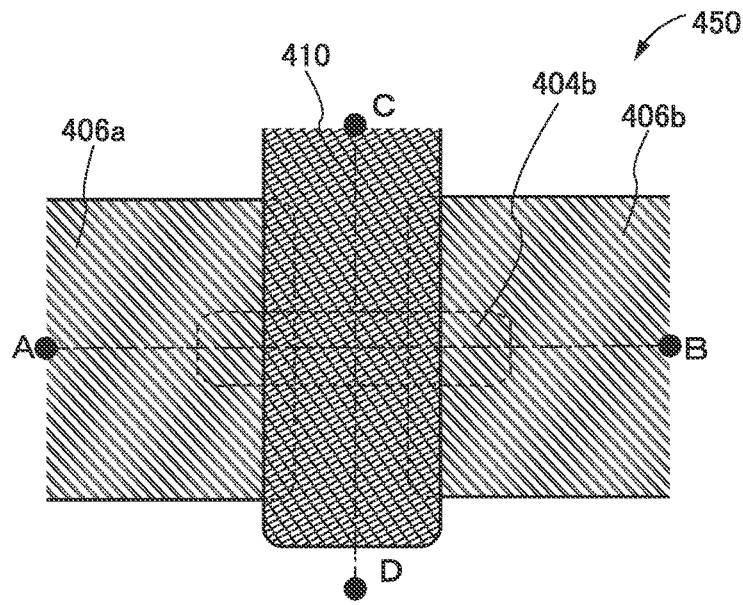
FIGS. 13A to 13C illustrate an example of a top view and cross-sectional views of a transistor.
Figure 13B:
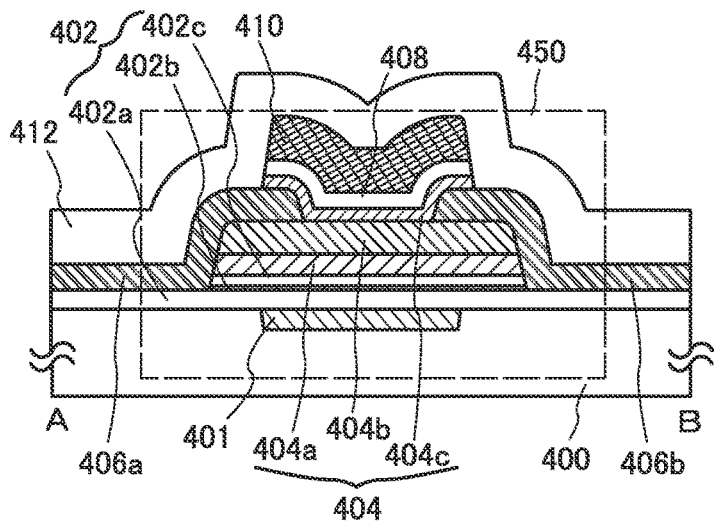
Figure 13C:
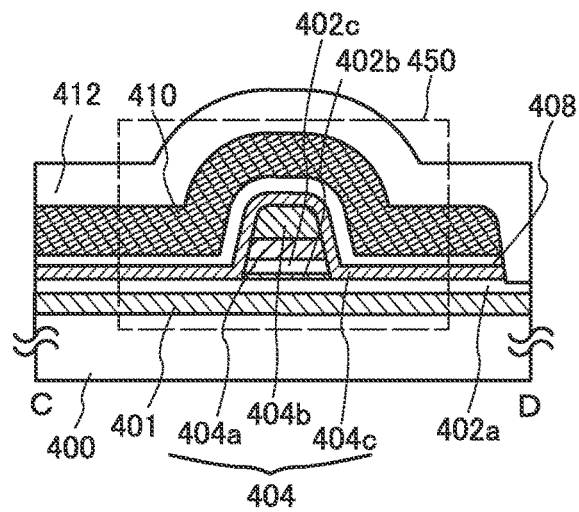

FIGS. 13A to 13C are a top view and cross-sectional views which illustrate the transistor 450. FIG. 13A is the top view. FIG. 13B illustrates a cross section taken along the dashed-dotted line A-B in FIG. 13A. FIG. 13C illustrates a cross section taken along the dashed-dotted line C-D in FIG. 13A. Note that for simplification of the drawing, some components in the top view in FIG. 13A are not illustrated. In some cases, the direction of the dashed-dotted line A-B is referred to as a channel length direction, and the direction of the dashed-dotted line C-D is referred to as a channel width direction.

The transistor 450 in FIGS. 13A to 13C includes a gate electrode 401 (corresponding to the gate electrode 103 in FIG. 2C) embedded in a substrate 400; a base insulating layer 402 including a projection and a depression over the substrate 400 and the gate electrode 401; an oxide semiconductor layer 404a and an oxide semiconductor layer 404b over the projection of the base insulating layer 402; a source electrode 406a and a drain electrode 406b over the oxide semiconductor layer 404a and the oxide semiconductor layer 404b; an oxide semiconductor layer 404c in contact with a bottom surface of the depression of the base insulating layer 402, a side surface of the depression (projection) of the base insulating layer 402, a side surface of the oxide semiconductor layer 404a, a side surface and a top surface of the oxide semiconductor layer 404b, the source electrode 406a, and the drain electrode 406b; a gate insulating layer 408 (corresponding to the gate insulating layer 104 in FIG. 2C) over the oxide semiconductor layer 404c; a gate electrode 410 (corresponding to the gate electrode 105 in FIG. 2C) provided over and in contact with the gate insulating layer 408 and facing the top surface and the side surface of the oxide semiconductor layer 404b, and an oxide insulating layer 412 over the source electrode 406a, the drain electrode 406b, and the gate electrode 410.

In addition, the base insulating layer 402 includes a first insulating layer 402a (corresponding to the third insulating layer 102c in FIG. 2C), a second insulating layer 402b (corresponding to the second insulating layer 102b in FIG. 2C), and a third insulating layer 402c (corresponding to the first insulating layer 102a in FIG. 2C) and functions as the charge trap layer described in Embodiment 1. The oxide semiconductor layers 404a, 404b, and 404c are collectively referred to as a multilayer semiconductor layer 404. The multilayer semiconductor layer 404 corresponds to the semiconductor layer 101 in FIG. 2C.

In the case where a material used as the second insulating layer 402b has a high relative dielectric constant, the second insulating layer 402b can be formed thick. For example, in the case of using hafnium oxide with a relative dielectric constant of 16, the second insulating layer 402b can be formed approximately four times as thick as the second insulating layer 402b using silicon oxide with a relative dielectric constant of 3.9. The increase in the thickness of the second insulating layer 402b is preferable in terms of preventing the leakage of trapped electrons. Note that each thickness of the first insulating layer 402a and the third insulating layer 402c is more than or equal to 1 nm and less than or equal to 30 nm, preferably more than or equal to 10 nm and less than or equal to 20 nm. The thickness of the second insulating layer 402b is more than or equal to 1 nm and less than or equal to 100 nm, preferably more than or equal to 5 nm and less than or equal to 20 nm.

Note that the channel length means the distance between a source (a source region, source electrode) and a drain (drain region, drain electrode) in a region where a semiconductor layer overlaps with a gate electrode in the top view. That is, the channel length in FIG. 13A is the distance between the source electrode 406a and the drain electrode 406b in the region where the oxide semiconductor layer 404b overlaps with the gate electrode 410. A channel width means a length of a region where a source faces parallel to a drain and where a semiconductor layer and a gate electrode overlap with each other. That is, in FIG. 13A, a channel width is a length of a portion where the source electrode 406a and the drain electrode 406b face each other and where the oxide semiconductor layer 404b and the gate electrode 410 overlap with each other.

When the base insulating layer 402 functions as an electron trap layer, electrons can be trapped in electron trap states existing at the interface between the third insulating layer 402c and the second insulating layer 402b or inside the second insulating layer 402b as described in Embodiment 1. The number of electrons trapped in the electron trap states can be adjusted by the potential of the gate electrode 401.

The gate electrode 410 electrically covers the oxide semiconductor layer 404b, increasing the on-state current. This transistor structure is referred to as a surrounded channel (s-channel) structure. In the s-channel structure, a current flows through an entire region of the oxide semiconductor layer 404b (bulk). Since a current flows through the oxide semiconductor layer 404b, an adverse effect of interface scattering is unlikely to occur, leading to a high on-state current. Note that as the oxide semiconductor layer 404b is thicker, the on-state current can be increased.

In formation of a transistor with a short channel length and a short channel width, when an electrode, a semiconductor layer, or the like is processed at the same time when a resist mask is recessed, the electrode, the semiconductor layer, or the like has a rounded upper end portion (curved surface) in some cases. With this structure, the coverage with the gate insulating layer 408, the gate electrode 410, and the oxide insulating layer 412, which are to be formed over the oxide semiconductor layer 404b, can be improved. In addition, electric field concentration that might occur at end portions of the source electrode 406a and the drain electrode 406b can be reduced, which can suppress deterioration of the transistor.

By miniaturization of the transistor, a high degree of integration and a high density can be achieved. For example, the channel length of the transistor is less than or equal to 100 nm, preferably less than or equal to 40 nm, further preferably less than or equal to 30 nm, and still further preferably less than or equal to 20 nm, and the channel width of the transistor is less than or equal to 100 nm, preferably less than or equal to 40 nm, further preferably less than or equal to 30 nm, and still further preferably less than or equal to 20 nm. Even with such a small channel width, the transistor 450 can increase the on-state current by having the s-channel structure.

The substrate 400 is not limited to a simple supporting substrate, and may be a substrate where another device such as a transistor is formed. In that case, at least one of the gate electrode 410, the source electrode 406a, and the drain electrode 406b of the transistor 450 may be electrically connected to the above device.

The base insulating layer 402 can have a function of supplying oxygen to the multilayer semiconductor layer 404 as well as a function of preventing diffusion of impurities from the substrate 400. In the case where the substrate 400 is provided with another device as described above, the base insulating layer 402 also has a function as an interlayer insulating layer. In that case, since the base insulating layer 402 has an uneven surface, the base insulating layer 402 is preferably subjected to planarization treatment such as chemical mechanical polishing (CMP) treatment so as to have a flat surface.

The multilayer semiconductor layer 404 in the channel formation region of the transistor 450 has a structure in which the oxide semiconductor layer 404a, the oxide semiconductor layer 404b, and the oxide semiconductor layer 404c are stacked in this order from the substrate 400 side. The oxide semiconductor layer 404b is surrounded by the oxide semiconductor layer 404a and the oxide semiconductor layer 404c. As in FIG. 13C, the gate electrode 410 electrically covers the oxide semiconductor layer 404b.

Here, for the oxide semiconductor layer 404b, for example, an oxide semiconductor whose electron affinity (an energy difference between a vacuum level and the conduction band minimum) is higher than those of the oxide semiconductor layer 404a and the oxide semiconductor layer 404c is used. The electron affinity can be obtained by subtracting an energy difference between the conduction band minimum and the valence band maximum (what is called an energy gap) from an energy difference between the vacuum level and the valence band maximum (what is called an ionization potential).

The oxide semiconductor layer 404a and the oxide semiconductor layer 404c each contain one or more kinds of metal elements forming the oxide semiconductor layer 404b. For example, the oxide semiconductor layer 404a and the oxide semiconductor layer 404c are preferably formed using an oxide semiconductor whose conduction band minimum is closer to a vacuum level than that of the oxide semiconductor layer 404b by 0.05 eV or more, 0.07 eV or more, 0.1 eV or more, or 0.15 eV or more and 2 eV or less, 1 eV or less, 0.5 eV or less, or 0.4 eV or less.

In such a structure, when an electric field is applied to the gate electrode 410, a channel is formed in the oxide semiconductor layer 404b where the conduction band minimum is the lowest in the multilayer semiconductor layer 404. In other words, the oxide semiconductor layer 404c is formed between the oxide semiconductor layer 404b and the gate insulating layer 408, whereby a structure in which the channel of the transistor is provided in a region that is not in contact with the gate insulating layer 408 is obtained.

Further, since the oxide semiconductor layer 404a contains one or more metal elements contained in the oxide semiconductor layer 404b, an interface state is unlikely to be formed at the interface between the oxide semiconductor layer 404b and the oxide semiconductor layer 404a, compared with the interface between the oxide semiconductor layer 404b and the base insulating layer 402 on the assumption that the oxide semiconductor layer 404b is in contact with the base insulating layer 402. The interface state sometimes forms a channel, leading to a change in the threshold of the transistor. Thus, with the oxide semiconductor layer 404a, a variation in the electrical characteristics of the transistor, such as threshold, can be reduced. Further, the reliability of the transistor can be improved.

Furthermore, since the oxide semiconductor layer 404c contains one or more metal elements contained in the oxide semiconductor layer 404b, scattering of carriers is unlikely to occur at the interface between the oxide semiconductor layer 404b and the oxide semiconductor layer 404c, compared with the interface between the oxide semiconductor layer 404b and the gate insulating layer 408 on the assumption that the oxide semiconductor layer 404b is in contact with the gate insulating layer 408. Thus, with the oxide semiconductor layer 404c, the field-effect mobility of the transistor can be increased.

For the oxide semiconductor layer 404a and the oxide semiconductor layer 404c, for example, a material containing Al, Ti, Ga, Ge, Y, Zr, Sn, La, Ce, or Hf with a higher atomic ratio than that used for the oxide semiconductor layer 404b can be used. Specifically, an atomic ratio of any of the above metal elements in the oxide semiconductor layer 404a and the oxide semiconductor layer 404c is 1.5 times or more, preferably 2 times or more, further preferably 3 times or more as much as that in the oxide semiconductor layer 404b. Any of the above metal elements is strongly bonded to oxygen and thus has a function of suppressing generation of an oxygen vacancy in the oxide semiconductor layer 404a and the oxide semiconductor layer 404c. That is, an oxygen vacancy is less likely to be generated in the oxide semiconductor layer 404a and the oxide semiconductor layer 404c than in the oxide semiconductor layer 404b.

Note that when each of the oxide semiconductor layer 404a, the oxide semiconductor layer 404b, and the oxide semiconductor layer 404c is an In-M-Zn oxide containing at least indium, zinc, and M (M is a metal such as Al, Ti, Ga, Ge, Y, Zr, Sn, La, Ce, or Hf), and when the oxide semiconductor layer 404a has an atomic ratio of In to M and Zn which is $x_1:y_1:z_1$, the oxide semiconductor layer 404b has an atomic ratio of In to M and Zn which is $x_2:y_2:z_2$, and the oxide semiconductor layer 404c has an atomic ratio of In to M and Zn which is $x_3:y_3:z_3$, $y_1/x_1$ and $y_3/x_3$ is each preferably larger than $y_2/x_2$. $Y_1/x_1$ and $y_3/x_3$ is each 1.5 times or more, preferably 2 times or more, further preferably 3 times or more as large as $y_2/x_2$. At this time, when $y_2$ is greater than or equal to $x_2$ in the oxide semiconductor layer 404b, the transistor can have stable electrical characteristics. However, when $y_2$ is 3 times or more as large as $x_2$, the field-effect mobility of the transistor is reduced; accordingly, $y_2$ is preferably less than 3 times $x_2$.

The proportion of In and M atoms In/M in the oxide semiconductor layer 404a and the oxide semiconductor layer 404c is preferably less than 1 and further preferably less than 0.33. In addition, the proportion of In and M atoms In/M in the oxide semiconductor layer 404b is preferably 0.34 or more and further preferably 0.5 or more.

The thicknesses of the oxide semiconductor layer 404a and the oxide semiconductor layer 404c are each greater than or equal to 3 nm and less than or equal to 100 nm, preferably greater than or equal to 3 nm and less than or equal to 50 nm. The thickness of the oxide semiconductor layer 404b is greater than or equal to 3 nm and less than or equal to 200 nm, preferably greater than or equal to 3 nm and less than or equal to 100 nm, further preferably greater than or equal to 3 nm and less than or equal to 50 nm. In addition, the oxide semiconductor layer 404b is preferably thicker than the oxide semiconductor layer 404a and the oxide semiconductor layer 404c.

For the oxide semiconductor layer 404a, the oxide semiconductor layer 404b, and the oxide semiconductor layer 404c, an oxide semiconductor containing indium, zinc, and gallium can be used, for example. Note that the oxide semiconductor layer 404b preferably contains indium because carrier mobility can be increased.

Note that stable electrical characteristics can be effectively imparted to a transistor using an oxide semiconductor layer, by reducing the concentration of impurities in the oxide semiconductor layer to make the oxide semiconductor layer intrinsic or substantially intrinsic. The term "substantially intrinsic" refers to the state where an oxide semiconductor layer has a carrier density lower than $1 \times 10^{17}/cm^3$, preferably lower than $1 \times 10^{15}/cm^3$, further preferably lower than $1 \times 10^{13}/cm$.

In the oxide semiconductor layer, hydrogen, nitrogen, carbon, silicon, and a metal element other than main components of the oxide semiconductor layer are impurities. For example, hydrogen and nitrogen form donor levels to increase the carrier density. In addition, silicon in the oxide semiconductor layer forms an impurity level. The impurity level might become a trap, so that the electrical characteristics of the transistor might deteriorate. Accordingly, in the oxide semiconductor layer 404a, the oxide semiconductor layer 404b, and the oxide semiconductor layer 404c and at interfaces between these layers, the impurity concentration is preferably reduced.

In order to make the oxide semiconductor layer intrinsic or substantially intrinsic, in secondary ion mass spectrometry (SIMS), for example, the concentration of silicon at a certain depth of the oxide semiconductor layer or in a region of the oxide semiconductor layer is preferably lower than $1 \times 10^{19}$ atoms/$cm^3$, further preferably lower than $5 \times 10^{18}$ atoms/$cm^3$, still further preferably lower than $1-10^{18}$ atoms/$cm^3$. Further, the concentration of hydrogen at a certain depth of the oxide semiconductor layer or in a region of the oxide semiconductor layer is preferably lower than or equal to $2 \times 10^{20}$ atoms/$cm^3$, further preferably lower than or equal to $5 \times 10^{19}$ atoms/$cm^3$, still further preferably lower than or equal to $1 \times 10^{19}$ atoms/$cm^3$, yet still further preferably lower than or equal to $5 \times 10^{18}$ atoms/$cm^3$. Further, the concentration of nitrogen at a certain depth of the oxide semiconductor layer or in a region of the oxide semiconductor layer is preferably lower than $5 \times 10^{19}$ atoms/$cm^3$, further preferably lower than or equal to $5 \times 10^{18}$ atoms/$cm^3$, still further preferably lower than or equal to $1 \times 10^{18}$ atoms/$cm^3$, yet still further preferably lower than or equal to $5 \times 10^{17}$ atoms/$cm^3$.

In the case where the oxide semiconductor layer includes crystals, high concentration of silicon or carbon might reduce the crystallinity of the oxide semiconductor layer. In order not to lower the crystallinity of the oxide semiconductor layer, for example, the concentration of silicon at a certain depth of the oxide semiconductor layer or in a region of the oxide semiconductor layer may be lower than $1 \times 10^{19}$ atoms/$cm^3$, preferably lower than $5 \times 10^{18}$ atoms/$cm^3$, further preferably lower than $1 \times 10^{18}$ atoms/$cm^3$. Further, the concentration of carbon at a certain depth of the oxide semiconductor layer or in a region of the oxide semiconductor layer may be lower than $1 \times 10^{19}$ atoms/$cm^3$, preferably lower than $5 \times 10^{18}$ atoms/$cm^3$, further preferably lower than $1 \times 10^{18}$ atoms/$cm^3$, for example.

A transistor in which the above-described highly purified oxide semiconductor layer is used for a channel formation region has an extremely low off-state current. In the case where the voltage between a source and a drain is set at about 0.1 V, 5 V, or 10 V, for example, the off-state current standardized on the channel width of the transistor can be as low as several yoctoamperes per micrometer to several zeptoamperes per micrometer.

Note that as the gate insulating layer of the transistor, an insulating layer containing silicon is used in many cases; thus, it is preferable that a region of the multilayer semiconductor layer, which serves as a channel, be not in contact with the gate insulating layer for the above-described reason. In the case where a channel is formed at the interface between the gate insulating layer and the multilayer semiconductor layer, scattering of carriers occurs at the interface, whereby the field-effect mobility of the transistor may be reduced. Also from the view of the above, it is preferable that the region of the multilayer semiconductor layer, which serves as a channel, be separated from the gate insulating layer.

Accordingly, with the multilayer semiconductor layer 404 having a stacked structure of the oxide semiconductor layers 404a, 404b, and 404c, a channel can be formed in the oxide semiconductor layer 404b; thus, the transistor can have high field-effect mobility and stable electrical characteristics.

Next, the band structure of the multilayer semiconductor layer 404 is described. For analyzing the band structure, a stacked film corresponding to the multilayer semiconductor layer 404 is formed. In the stacked film. In—Ga—Zn oxide with an energy gap of 3.5 eV is used for layers corresponding to the oxide semiconductor layer 404a and the oxide semiconductor layer 404c, and In—Ga—Zn oxide with an energy gap of 3.15 eV is used for a layer corresponding to the oxide semiconductor layer 404b.

The thickness of each of the oxide semiconductor layer 404a, the oxide semiconductor layer 404b, and the oxide semiconductor layer 404c was 10 nm. The energy gap was measured with the use of a spectroscopic ellipsometer (UT-300 manufactured by HORIBA Jobin Yvon). Further, the energy difference between the vacuum level and the valence band maximum was measured using an ultraviolet photoelectron spectroscopy (UPS) device (VersaProbe, ULVAC-PHI, Inc.).

Figure 14A:
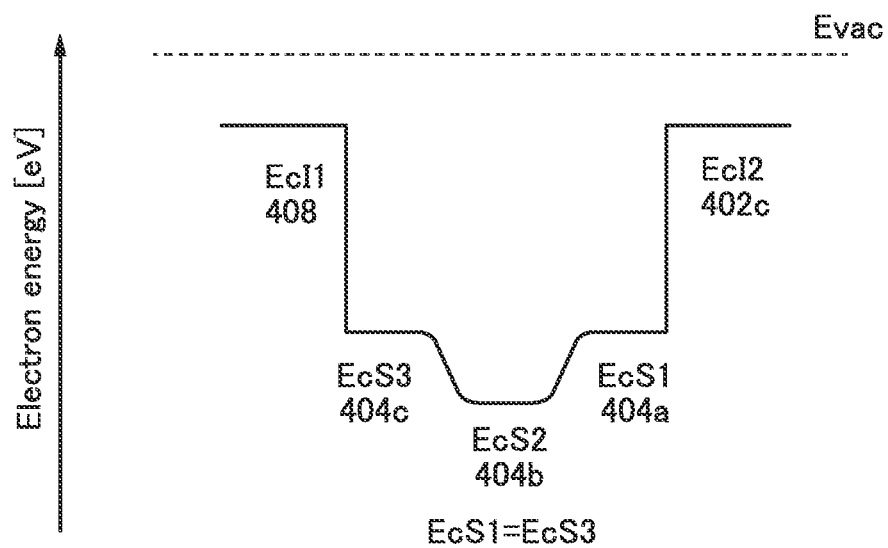
FIGS. 14A and 14B illustrate examples of a schematic band diagram of stacked semiconductor layers.

FIG. 14A is part of a schematic band structure showing an energy difference (electron affinity) between the vacuum level and the conduction band minimum of each layer, which is calculated by subtracting the energy gap from the energy difference between the vacuum level and the valence band maximum. FIG. 14A is a band diagram showing the case where silicon oxide layers are provided in contact with the oxide semiconductor layer 404a and the oxide semiconductor layer 404c. Here, Evac represents energy of the vacuum level, EcI1 and EcI2 represent the conduction band minimum of the silicon oxide layer, EcS1 represents the conduction band minimum of the oxide semiconductor layer 404a. EcS2 represents the conduction band minimum of the oxide semiconductor layer 404b, and EcS3 represents the conduction band minimum of the oxide semiconductor layer 404c.

As shown in FIG. 14A, the conduction band minimum continuously varies among the oxide semiconductor layer 404a, the oxide semiconductor layer 404b, and the oxide semiconductor layer 404c. This can be understood also from the fact that the constituent elements are common among the oxide semiconductor layer 404a, the oxide semiconductor layer 404b, and the oxide semiconductor layer 404c and oxygen is easily diffused among the oxide semiconductor layers 404a to 404c. Accordingly, the oxide semiconductor layer 404a, the oxide semiconductor layer 404b, and the oxide semiconductor layer 404c have a continuous physical property although they have different compositions in a stack.

The multilayer semiconductor layer 404 in which layers containing the same main components are stacked is formed to have not only a simple stacked-layer structure of the layers but also a continuous energy band (here, in particular, a well structure having a U shape in which the conduction band minimum continuously varies among the layers). In other words, the stacked-layer structure is formed such that there exist no impurities that form a defect level such as a trap center or a recombination center at each interface. If impurities exist between the stacked layers in the multilayer semiconductor layer, the continuity of the energy band is lost and carriers at the interface disappear by a trap or recombination.

Note that FIG. 14A shows the case where EcS1 and EcS3 are equal to each other; however, EcS1 and EcS3 may be different from each other. For example, part of the band structure in the case where EcS1 is higher than EcS3 is shown in FIG. 14B.

For example, when EcS1 is equal to EcS3, an In—Ga—Zn oxide whose atomic ratio of In to Ga and Zn is 1:3:2, 1:3:3, 1:3:4, 1:6:4, or 1:9:6 can be used for the oxide semiconductor layer 404a and the oxide semiconductor layer 404c and an In—Ga—Zn oxide whose atomic ratio of In to Ga and Zn is 1:1:1 or 3:1:2 can be used for the oxide semiconductor layer 404b. Further, when EcS1 is higher than EcS3, an In—Ga—Zn oxide whose atomic ratio of In to Ga and Zn is 1:6:4 or 1:9:6 can be used for the oxide semiconductor layer 404a, an In—Ga—Zn oxide whose atomic ratio of In to Ga and Zn is 1:1:1 or 3:1:2 can be used for the oxide semiconductor layer 404b, and an In—Ga—Zn oxide whose atomic ratio of In to Ga and Zn is 1:3:2, 1:3:3, or 1:3:4 can be used for the oxide semiconductor layer 404c, for example.

Figure 14B:
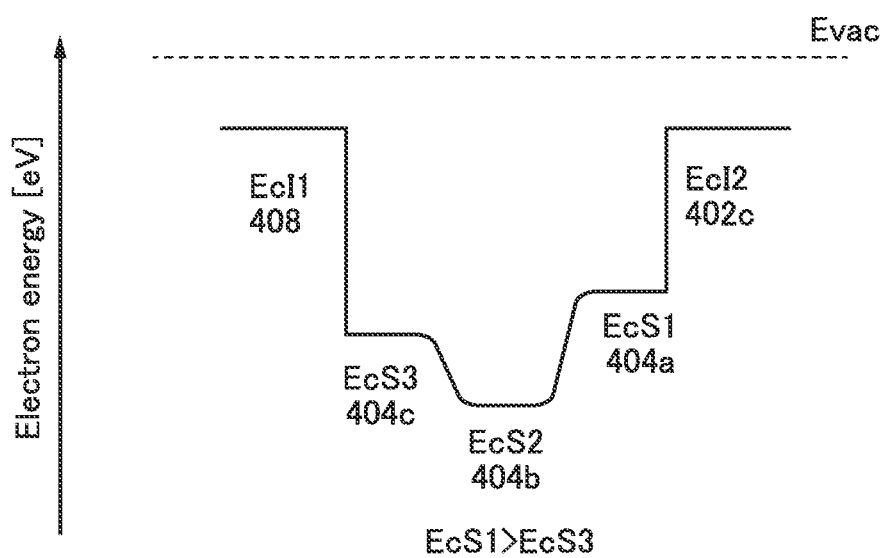

According to FIGS. 14A and 14B, the oxide semiconductor layer 404b of the multilayer semiconductor layer 404 serves as a well, so that a channel is formed in the oxide semiconductor layer 404b in a transistor including the multilayer semiconductor layer 404. Note that since the conduction band minimum continuously varies, the multilayer semiconductor layer 404 can also be referred to as a U-shaped well. Further, a channel formed to have such a structure can also be referred to as a buried channel.

Note that trap levels due to impurities or defects might be formed in the vicinity of the interface between the oxide semiconductor layers 404a and 404c and an insulating layer such as a silicon oxide layer. The oxide semiconductor layer 404b can be distanced away from the trap levels owing to existence of the oxide semiconductor layer 404a and the oxide semiconductor layer 404c. However, when the energy difference between EcS2 and EcS1 or between EcS2 and EcS3 is small, an electron in the oxide semiconductor layer 404b might reach the trap levels by passing over the oxide semiconductor layer 404a or the oxide semiconductor layer 404c. When electrons serving as negative fixed charges are trapped in the trap levels, the threshold of the transistor shifts in the positive direction.

Thus, to reduce a variation in the threshold voltage of the transistor, energy differences between EcS2 and each of EcS1 and EcS3 are necessary. Each of the energy differences is preferably greater than or equal to 0.1 eV, further preferably greater than or equal to 0.15 eV.

The oxide semiconductor layer 404a, the oxide semiconductor layer 404b, and the oxide semiconductor layer 404c preferably include crystal parts. In particular, when a crystal in which c-axes are aligned is used, the transistor can have stable electrical characteristics.

In the case where an In—Ga—Zn oxide is used for the multilayer semiconductor layer 404, it is preferable that the oxide semiconductor layer 404c contain less In than the oxide semiconductor layer 404b so that diffusion of In to the gate insulating layer is prevented.

For the source electrode 406a and the drain electrode 406b, a conductive material that can be bonded to oxygen is preferably used. For example, Al, Cr, Cu, Ta, Ti, Mo, or W can be used. Among the materials, in particular, it is preferable to use Ti which is easily bonded to oxygen or to use W with a high melting point, which allows subsequent process temperatures to be relatively high. Note that the conductive material that can be bonded to oxygen includes, in its category, a material to which oxygen is easily diffused.

When the conductive material that can be bonded to oxygen is in contact with a multilayer semiconductor layer, a phenomenon occurs in which oxygen in the multilayer semiconductor layer is diffused to the conductive material that can be bonded to oxygen. The phenomenon noticeably occurs when the temperature is high. Since the fabricating process of the transistor involves some heat treatment steps, the above phenomenon causes generation of oxygen vacancies in the vicinity of a region which is in the multilayer semiconductor layer and is in contact with the source electrode or the drain electrode. The oxygen vacancies bond to hydrogen that is slightly contained in the layer, whereby the region is changed to an n-type region. Thus, the n-type region can serve as a source or a drain of the transistor.

In the case of forming a transistor with an extremely short channel length, an n-type region which is formed by the generation of oxygen vacancies might extend in the channel length direction of the transistor, causing a short circuit. In that case, the electrical characteristics of the transistor change: for example, the threshold voltage shifts to cause a state in which on and off states of the transistor cannot be controlled with the gate voltage (conduction state). Accordingly, when a transistor with an extremely short channel length is formed, it is not always preferable that a conductive material that can be bonded to oxygen be used for a source electrode and a drain electrode.

In such a case, a conductive material which is less likely to be bonded to oxygen than the above material is preferably used for the source electrode 406a and the drain electrode 406b. As the conductive material which is not easily bonded to oxygen, for example, a material containing tantalum nitride, titanium nitride, or ruthenium or the like can be used. Note that in the case where the conductive material is in contact with the oxide semiconductor layer 404b, the conductive materials may be stacked with the above-described conductive material which is easily bonded to oxygen.

The first insulating layer 402a, the third insulating layer 402c, and the gate insulating layer 408 can be formed using an insulating layer containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The second insulating layer 402b can be formed using an insulating layer containing one or more of hafnium oxide, aluminum oxide, aluminum silicate, and the like. Note that each thickness of the first insulating layer 402a and the third insulating layer 402c is more than or equal to 1 nm and less than or equal to 30 nm, preferably more than or equal to 10 nm and less than or equal to 20 nm. The thickness of the second insulating layer 402b is more than or equal to 1 nm and less than or equal to 20 nm, preferably more than or equal to 5 nm and less than or equal to 10 nm.

For the gate electrodes 401 and 410, a conductive layer formed using Al, Ti, Cr, Co, Ni, Cu, Y, Zr, Mo, Ru, Ag, Ta, W, or the like can be used. The gate electrodes 401 and 410 may be a stack including any of the above materials. Alternatively, a conductive layer containing nitrogen may be used for the gate electrodes 401 and 410. For example, the gate electrodes 401 and 410 can be a stack in which a tungsten layer is formed over a titanium nitride layer, a stack in which a tungsten layer is formed over a tungsten nitride layer, or a stack in which a tungsten layer is formed over a tantalum nitride layer.

The oxide insulating layer 412 may be formed over the gate insulating layer 408 and the gate electrode 410. The oxide insulating layer 412 can be formed using an insulating layer containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, and tantalum oxide. The oxide insulating layer 412 may be a stack including any of the above materials.

Here, the oxide insulating layer 412 preferably contains excess oxygen. An oxide insulating layer containing excess oxygen refers to an oxide insulating layer from which oxygen can be released by heat treatment or the like. The oxide insulating layer containing excess oxygen is preferably a layer in which the amount of released oxygen when converted into oxygen atoms is $1.0 \times 10^{19}$ atoms/cm$^3$ or more in thermal desorption spectroscopy analysis. Note that the temperature of the oxide insulating layer surface in the thermal desorption spectroscopy analysis is preferably higher than or equal to 100° C. and lower than or equal to 700° C., or higher than or equal to 100° C. and lower than or equal to 500° C. Oxygen released from the oxide insulating layer can be diffused to the channel formation region in the multilayer semiconductor layer 404 through the gate insulating layer 408, so that oxygen vacancies formed in the channel formation region can be filled with the oxygen. In this manner, stable electrical characteristics of the transistor can be achieved.

High integration of a semiconductor device requires miniaturization of a transistor. However, it is known that miniaturization of a transistor causes deterioration of the electrical characteristics of the transistor. When a channel width is shortened, an on-state current is decreased.

However, in the transistor of this embodiment, as described above, the oxide semiconductor layer 404c is formed so as to cover a region where a channel is formed in the oxide semiconductor layer 404b, and a channel formation layer and the gate insulating layer are not in contact with each other. Accordingly, scattering of carriers at the interface between a channel formation layer and the gate insulating layer can be reduced and the on-state current of the transistor can be increased.

When the oxide semiconductor layer is formed to be intrinsic or substantially intrinsic, the field-effect mobility might be reduced because of a decrease in the number of carriers contained in the oxide semiconductor layer. However, in the transistor of this embodiment, a gate electric field is applied to the oxide semiconductor layer in the side surface direction in addition to the perpendicular direction. That is, the gate electric field is applied to the whole of the oxide semiconductor layer, whereby current flows in the bulk of the oxide semiconductor layer. Consequently, a change in the electrical characteristics can be suppressed owing to the highly purified intrinsic oxide semiconductor layer and the field-effect mobility of the transistor can be increased.

In the transistor of this embodiment, the oxide semiconductor layer 404b is formed over the oxide semiconductor layer 404a, so that an interface state is less likely to be formed. In addition, impurities do not enter the oxide semiconductor layer 404b from above and below because the oxide semiconductor layer 404b is an intermediate layer in a three-layer structure. With the structure in which the oxide semiconductor layer 404b is surrounded by the oxide semiconductor layer 404a and the oxide semiconductor layer 404c (or the oxide semiconductor layer 404b is electrically surrounded by the gate electrode 410), on-state current of the transistor is increased as described above, and in addition, threshold voltage can be stabilized and an S value can be reduced. Thus, Icut can be reduced and power consumption can be reduced. Furthermore, the threshold of the transistor becomes stable; thus, long-term reliability of the semiconductor device can be improved.

Figure 15A:
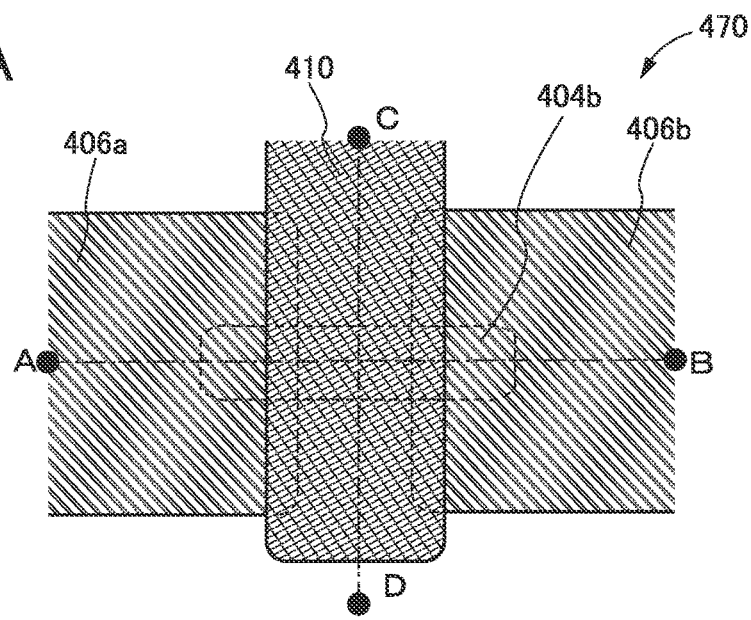
FIGS. 15A to 15C illustrate an example of a top view and cross-sectional views of a transistor.
Figure 15B:
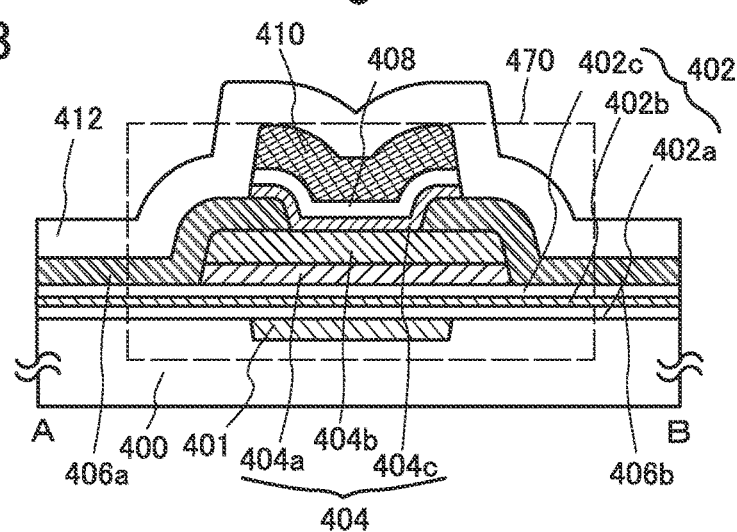
Figure 15C:
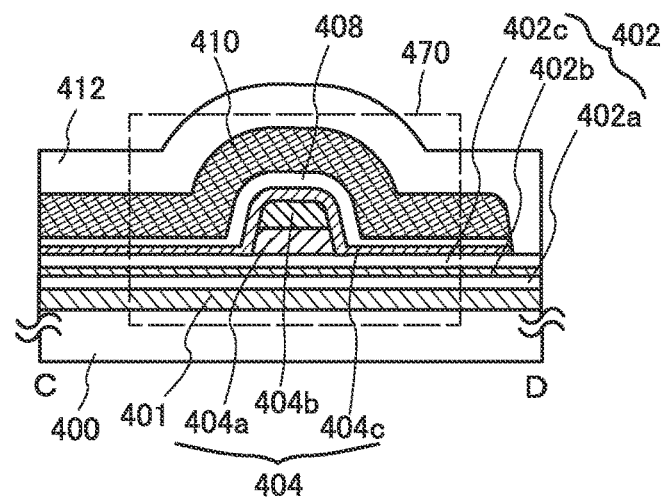

A transistor 470 illustrated in FIGS. 15A to 15C can be used. FIGS. 15A to 15C are a top view and cross-sectional views which illustrate the transistor 470. FIG. 15A is the top view. FIG. 15B illustrates a cross section taken along the dashed-dotted line A-B in FIG. 15A. FIG. 15C illustrates a cross section taken along the dashed-dotted line C-D in FIG. 15A. Note that for simplification of the drawing, some components are not illustrated in the top view in FIG. 15A.

In the transistor 470, the base insulating layer 402 is not etched because overetching of a conductive layer to be the source electrode 406a and the drain electrode 406b does not occur when the source electrode 406a and the drain electrode 406b are formed.

To prevent the base insulating layer 402 from being etched by overetching of the conductive layer, the etching rate of the base insulating layer 402 is preferably set (sufficiently) lower than the etching rate of the conductive layer.

In this embodiment, although the oxide semiconductor layer 404b is sandwiched between the oxide semiconductor layer 404a and the oxide semiconductor layer 404c, without limited to this structure, one embodiment of the present invention may have a structure in which only the oxide semiconductor layer 404b is provided without the oxide semiconductor layer 404a and the oxide semiconductor layer 404c and is electrically covered with the gate electrode.

This embodiment can be combined with any of the other embodiments in this specification as appropriate.

Embodiment 3

In this embodiment, a method for forming the transistor 450, which is described in Embodiment 2 with reference to FIGS. 13A to 13C, is described with reference to FIGS. 16A to 16D and FIGS. 17A to 17C.

Figure 16A:
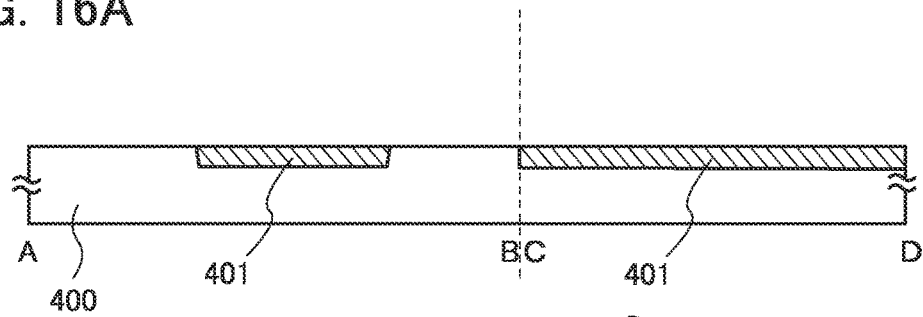
FIGS. 16A to 16D illustrate an example of a method for manufacturing a transistor.

To form the gate electrode 401, a plurality of linear grooves is formed on the substrate 400, a conductive layer is deposited using Al, Ti, Cr, Co, Ni, Cu, Y, Zr, Mo, Ru, Ag, Ta, W, or an alloy material containing any of these as a main component, and is planarized and etched (see FIG. 16A). The conductive layer can be formed by sputtering, CVD, or the like.

For the substrate 400, a glass substrate, a ceramic substrate, a quartz substrate, a sapphire substrate, or the like can be used. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used. Any of these substrates further provided with a semiconductor element thereover may be used.

Figure 16B:
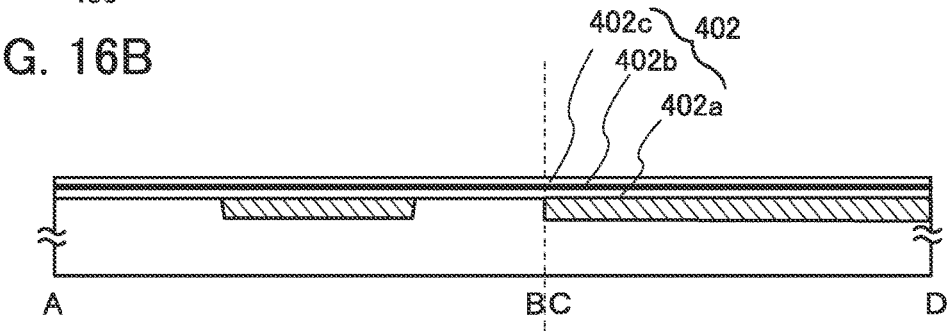
Figure 16C:
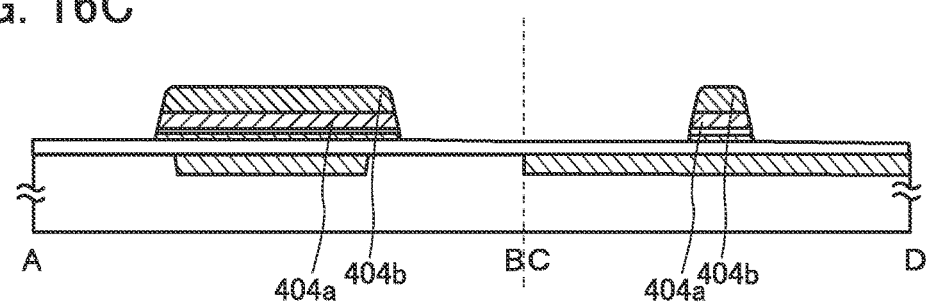

Furthermore, the base insulating layer 402 composed of the first to third insulating layers 402a to 402c is formed (see FIG. 16B).

Oxygen may be added to the base insulating layer 402 by an ion implantation method, an ion doping method, a plasma immersion ion implantation method, or the like. Adding oxygen enables the base insulating layer 402 to supply oxygen much easily to the multilayer semiconductor layer 404.

Next, the oxide semiconductor layers 404a and 404b are formed over the base insulating layer 402 by sputtering, CVD (including MOCVD. ALD, or PECVD), vacuum evaporation, or pulse laser deposition (PLD) (see FIG. 16C). At this time, as illustrated, the base insulating layer 402 can be slightly over-etched. By over-etching of the base insulating layer 402, the gate electrode 410 to be formed later can cover the oxide semiconductor layer 404c easily.

For processing the oxide semiconductor layer 404a and the oxide semiconductor layer 404b into island shapes, a layer to be a hard mask (e.g., a tungsten layer) and a resist mask are provided over the oxide semiconductor layer 404b, and the layer to be a hard mask is etched to form a hard mask. The resist mask is removed and then the oxide semiconductor layer 404a and the oxide semiconductor layer 404b are etched using the hard mask as a mask. Then, the resist mask is removed. At this step, the hard mask is gradually reduced as the etching progresses; as a result, the edges of the hard mask is rounded to have a curved surface. Accordingly, the edges of the oxide semiconductor layer 404b is rounded to have a curved surface. This structure improves the coverage with the oxide semiconductor layer 404c, the gate insulating layer 408, the gate electrode 410, and the oxide insulating layer 412, which are to be formed over the oxide semiconductor layer 404b, and can prevent shape defects such as disconnection. In addition, electric field concentration which might occur at end portions of the source electrode 406a and the drain electrode 406b can be reduced, which can reduce deterioration of the transistor.

In order to form continuous junction in a stacked-layer including the oxide semiconductor layers 404a and 404b, or a stacked-layer including the oxide semiconductor layers 404a, 404b, and 404c to be formed in a later step, the layers need to be formed successively without exposure to the air with the use of a multi-chamber deposition apparatus (e.g., a sputtering apparatus) including a load lock chamber. It is preferable that each chamber of the sputtering apparatus be able to be evacuated to a high vacuum (to about $5 \times 10^{-7}$ Pa to $1 \times 10^{-4}$ Pa) by an adsorption vacuum pump such as a cryopump and that the chamber be able to heat a substrate to 100° C. or higher, preferably 500° C. or higher so that water and the like acting as impurities of the oxide semiconductor can be removed as much as possible. Alternatively, a combination of a turbo molecular pump and a cold trap is preferably used to prevent back-flow of a gas containing a carbon component, moisture, or the like from an exhaust system into the chamber.

Not only high vacuum evacuation in a chamber but also increasing the purity of a sputtering gas is necessary to obtain a high-purity intrinsic oxide semiconductor. As an oxygen gas or an argon gas used for a sputtering gas, a gas which is highly purified to have a dew point of −40° C. or lower, preferably −80° C. or lower, further preferably −100° C. or lower is used, whereby entry of moisture or the like into the oxide semiconductor layer can be prevented as much as possible.

The materials described in Embodiment 2 can be used for the oxide semiconductor layer 404a, the oxide semiconductor layer 404b, and the oxide semiconductor layer 404c that is to be formed in a later step. For example, an In—Ga—Zn oxide whose atomic ratio of In to Ga and Zn is 1:3:4 or 1:3:2 can be used for the oxide semiconductor layer 404a, an In—Ga—Zn oxide whose atomic ratio of In to Ga and Zn is 1:1:1 can be used for the oxide semiconductor layer 404b, and an In—Ga—Zn oxide whose atomic ratio of In to Ga and Zn is 1:3:4 or 1:3:2 can be used for the oxide semiconductor layer 404c.

An oxide semiconductor that can be used for each of the oxide semiconductor layers 404a, 404b, and 404c preferably contains at least indium (In) or zinc (Zn). Both In and Zn are preferably contained. Furthermore, in order to reduce variations in electrical characteristics of the transistors including the oxide semiconductor, the oxide semiconductor preferably contains a stabilizer in addition to In and Zn.

As a stabilizer, gallium (Ga), tin (Sn), hafnium (Hf), aluminum (Al), zirconium (Zr), and the like are used. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As the oxide semiconductor, for example, any of the following can be used: indium oxide, tin oxide, zinc oxide. In—Zn oxide, Sn—Zn oxide. Al—Zn oxide, Zn—Mg oxide, Sn—Mg oxide, In—Mg oxide, In—Ga oxide, In—Ga—Zn oxide, In—Al—Zn oxide, In—Sn—Zn oxide, Sn—Ga—Zn oxide, Al—Ga—Zn oxide, Sn—Al—Zn oxide, In—Hf—Zn oxide, In—La—Zn oxide, In—Ce—Zn oxide, In—Pr—Zn oxide, In—Nd—Zn oxide. In—Sm—Zn oxide, In—Eu—Zn oxide, In—Gd—Zn oxide, In—Tb—Zn oxide, In—Dy—Zn oxide, In—Ho—Zn oxide, In—Er—Zn oxide, In—Tm—Zn oxide, In—Yb—Zn oxide, In—Lu—Zn oxide, In—Sn—Ga—Zn oxide, In—Hf—Ga—Zn oxide, In—Al—Ga—Zn oxide, In—Sn—Al—Zn oxide, In—Sn—Hf—Zn oxide, or In—Hf—Al—Zn oxide.

For example, "In—Ga—Zn oxide" means an oxide containing In, Ga, and Zn as its main components. The In—Ga—Zn oxide may contain another metal element in addition to In, Ga, and Zn. Note that in this specification, a layer containing the In—Ga—Zn oxide is also referred to as an IGZO layer.

Alternatively, a material represented by $InMO_3(ZnO)_m$ (m>0 is satisfied, and m is not an integer) may be used. Note that M represents one or more metal elements selected from Ga, Fe, Mn, or Co. A material represented by $In_2SnO_5(ZnO)_n$ (n>0, n is an integer) may be used.

Note that as described in Embodiment 2 in detail, materials are selected so that the oxide semiconductor layers 404a and 404c each have an electron affinity lower than that of the oxide semiconductor layer 404b.

Note that the oxide semiconductor layer is preferably formed by a sputtering method. As a sputtering method, an RF sputtering method, a DC sputtering method, an AC sputtering method, or the like can be used. In particular, a DC sputtering method is preferably used because dust generated in the film formation can be reduced and the film thickness can be uniform.

When In—Ga—Zn oxide is used for the oxide semiconductor layers 404a, 404b, and 404c, a material whose atomic ratio of In to Ga and Zn is any of 1:1:1, 2:2:1, 3:1:2, 1:3:2, 1:3:4, 1:4:3, 1:5:4, 1:6:6, 2:1:3 1:6:4, 1:9:6, 1:1:4, and 1:1:2 is used so that the oxide semiconductor layers 404a and 404c each have an electron affinity lower than that of the oxide semiconductor layer 404b.

Note that the expression "the composition of an oxide including In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The indium content in the oxide semiconductor layer 404b is preferably higher than those in the oxide semiconductor layers 404a and 404c. In an oxide semiconductor, the s orbital of heavy metal mainly contributes to carrier transfer, and when the proportion of In in the oxide semiconductor is increased, overlap of the s orbitals is likely to be increased. Therefore, an oxide having a composition in which the proportion of In is higher than that of Ga has higher mobility than an oxide having a composition in which the proportion of In is equal to or lower than that of Ga. Thus, with use of an oxide having a high indium content for the oxide semiconductor layer 404b, a transistor having high mobility can be achieved.

Here, a structure of an oxide semiconductor layer will be described.

In this specification, a term "parallel" indicates that the angle formed between two straight lines is greater than or equal to −10° and less than or equal to 100, and accordingly also includes the case where the angle is greater than or equal to −5° and less than or equal to 50. The term "perpendicular" indicates that the angle formed between two straight lines is greater than or equal to 800 and less than or equal to 1000, and accordingly includes the case where the angle is greater than or equal to 850 and less than or equal to 95°.

In this specification, trigonal and rhombohedral crystal systems are included in a hexagonal crystal system.

An oxide semiconductor layer is classified roughly into a non-single-crystal oxide semiconductor layer and a single crystal oxide semiconductor layer. The non-single-crystal oxide semiconductor layer includes any of a c-axis aligned crystalline oxide semiconductor (CAAC-OS) layer, a polycrystalline oxide semiconductor layer, a microcrystalline oxide semiconductor layer, an amorphous oxide semiconductor layer, and the like.

First of all, a CAAC-OS layer is described.

The CAAC-OS layer is an oxide semiconductor layer including a plurality of crystal parts. Most of the crystal parts each fit inside a cube whose one side is less than 100 nm. Thus, the CAAC-OS layer may include a crystal part that fits inside a cube whose one side is less than 10 nm, less than 5 nm, or less than 3 nm.

In a transmission electron microscope (TEM) image of the CAAC-OS layer, a boundary between crystal parts, that is, a grain boundary is not clearly observed. Thus, in the CAAC-OS layer, a reduction in electron mobility due to the grain boundary is less likely to occur.

In the TEM image of the CAAC-OS layer observed in a direction substantially parallel to a sample surface (cross-sectional TEM image), metal atoms are arranged in a layered manner in the crystal parts. Each metal atom layer has a morphology reflecting a surface over which the CAAC-OS layer is formed (hereinafter, a surface over which the CAAC-OS layer is formed is referred to as a formation surface) or a top surface of the CAAC-OS layer, and is arranged to be parallel to the formation surface or the top surface of the CAAC-OS layer.

In the TEM image of the CAAC-OS layer observed in a direction substantially perpendicular to the sample surface (planar TEM image), metal atoms are arranged in a triangular or hexagonal configuration in the crystal parts. However, there is no regularity in arrangement of metal atoms between different crystal parts.

From the cross-sectional TEM image and the planar TEM image, orientation characteristics are found in the crystal parts in the CAAC-OS layer.

A CAAC-OS layer is subjected to structural analysis with an X-ray diffraction (XRD) apparatus. For example, when the CAAC-OS layer including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS have c-axis alignment, and that the c-axes are aligned in a direction substantially perpendicular to the formation surface or the top surface of the CAAC-OS layer.

When the CAAC-OS layer is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Analysis (φ scan) is performed under conditions where the sample is rotated around a normal vector of the sample surface as an axis (φ axis) with 2θ fixed at around 56°. When the sample is a single-crystal oxide semiconductor layer of InGaZnO$_4$, six peaks appear. The six peaks are derived from crystal planes equivalent to the (110) plane. In contrast, when the sample is the CAAC-OS layer, a peak is not clearly observed.

The above results mean that in the CAAC-OS layer having c-axis alignment, the directions of a-axes and b-axes are different between crystal parts, but the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS layer or is formed through crystallization treatment such as heat treatment. As described above, the c-axis of the crystal is oriented in a direction parallel to a normal vector of a formation surface or a normal vector of a top surface. Thus, for example, when the shape of the CAAC-OS layer is changed by etching or the like, the c-axis might not be necessarily parallel to a normal vector of a formation surface or a normal vector of a top surface of the CAAC-OS layer.

Furthermore, the degree of crystallinity in the CAAC-OS layer is not necessarily uniform. For example, if crystal growth leading to the CAAC-OS layer occurs from the vicinity of the top surface of the layer, the degree of crystallinity in the vicinity of the top surface may be higher than that in the vicinity of the formation surface. Moreover, when an impurity is added to the CAAC-OS layer, the crystallinity in a region to which the impurity is added is changed, and the degree of crystallinity in the CAAC-OS layer varies depending on regions.

Note that when the CAAC-OS layer with an InGaZnO$_4$ crystal is analyzed by an out-of-plane method, a peak of 2θ may be observed at around 36, in addition to the peak of 2θ at around 310. The peak of 2θ at around 36° indicates that a crystal having no c-axis alignment is included in part of the CAAC-OS layer. It is preferable that a peak of 2θ appear at around 31° and a peak of 2θ not appear at around 360.

The CAAC-OS layer is an oxide semiconductor layer having low impurity concentration. The impurity is an element other than the main components of the oxide semiconductor layer, such as hydrogen, carbon, silicon, or a transition metal element. In particular, an element that has higher bonding strength to oxygen than a metal element included in the oxide semiconductor layer, such as silicon, disturbs the atomic arrangement of the oxide semiconductor layer by depriving the oxide semiconductor layer of oxygen and causes a decrease in crystallinity. A heavy metal such as iron or nickel, argon, carbon dioxide, or the like has a large atomic radius (molecular radius), and thus disturbs the atomic arrangement of the oxide semiconductor layer and causes a decrease in crystallinity if contained in the oxide semiconductor layer. Note that the impurity contained in the oxide semiconductor layer might serve as a carrier trap or a carrier generation source.

The CAAC-OS layer is an oxide semiconductor layer having a low density of defect states. Oxygen vacancies in the oxide semiconductor layer may serve as carrier traps or carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor layer has few carrier generation sources, and thus can have a low carrier density. Thus, a transistor including the oxide semiconductor layer rarely has negative threshold voltage (is rarely normally on). The highly purified intrinsic or substantially highly purified intrinsic oxide semiconductor layer has few carrier traps. Accordingly, the transistor including the oxide semiconductor layer has little variation in electrical characteristics and high reliability. Electric charge trapped by the carrier traps in the oxide semiconductor layer takes a long time to be released, and thus may behave like fixed electric charge. Accordingly, the transistor which includes the oxide semiconductor layer having high impurity concentration and a high density of defect states can have unstable electrical characteristics.

In a transistor using the CAAC-OS layer, change in electrical characteristics due to irradiation with visible light or ultraviolet light is small.

Next, a microcrystalline oxide semiconductor layer will be described.

In a TEM image, crystal parts cannot be found clearly in the microcrystalline oxide semiconductor layer in some cases. In most cases, the crystal part size in the microcrystalline oxide semiconductor is more than or equal to 1 nm and less than or equal to 100 nm, or more than or equal to 1 nm and less than or equal to 10 nm. A microcrystal with a size more than or equal to 1 nm and less than or equal to 10 nm, or a size more than or equal to 1 nm and less than or equal to 3 nm is specifically referred to as nanocrystal (nc). An oxide semiconductor layer including nanocrystal is referred to as an nc-OS (nanocrystalline oxide semiconductor) layer. In a TEM image of the nc-OS layer, for example, a crystal grain boundary is not clearly found in some cases.

In the nc-OS layer, a microscopic region (for example, a region with a size more than or equal to 1 nm and less than or equal to 10 nm, in particular, a region with a size more than or equal to 1 nm and less than or equal to 3 nm) has a periodic atomic order. There is no regularity of crystal orientation between different crystal parts in the nc-OS layer. Thus, the orientation of the whole layer is not observed. Accordingly, the nc-OS layer sometimes cannot be distinguished from an amorphous oxide semiconductor layer depending on an analysis method. For example, when the nc-OS layer is subjected to structural analysis by an out-of-plane method with an XRD apparatus using an X-ray having a diameter larger than that of a crystal part, a peak which shows a crystal plane does not appear. Furthermore, a halo pattern is shown in an electron diffraction pattern (also referred to as a selected-area electron diffraction pattern) of the nc-OS layer obtained by using an electron beam having a probe diameter (e.g., more than or equal to 50 nm) larger than the diameter of a crystal part. Meanwhile, spots are shown in a nanobeam electron diffraction pattern of the nc-OS layer obtained by using an electron beam having a probe diameter (e.g., more than or equal to 1 nm and smaller than or equal to 30 nm) close to, or smaller than or equal to a diameter of a crystal part. In a nanobeam electron diffraction pattern of the nc-OS layer, regions with high luminance in a circular (ring) pattern may be shown, and a plurality of spots may be shown in the ring-like region.

The nc-OS layer is an oxide semiconductor layer that has high regularity as compared with an amorphous oxide semiconductor layer. For this reason, the nc-OS layer has a lower density of defect states than an amorphous oxide semiconductor layer. However, there is no regularity of crystal orientation between different crystal parts in the nc-OS layer; hence, the nc-OS layer has a higher density of defect states than the CAAC-OS layer.

Note that an oxide semiconductor layer may be a stacked layer including two or more layers of an amorphous oxide semiconductor layer, a microcrystalline oxide semiconductor layer, and a CAAC-OS layer, for example.

For example, the CAAC-OS layer can be deposited by a sputtering method using a polycrystalline oxide semiconductor sputtering target. When ions collide with the sputtering target, a crystal region included in the sputtering target is sometimes separated from the target along an a-b plane; in other words, a sputtered particle having a plane parallel to an a-b plane (flat-plate-like sputtered particle or pellet-like sputtered particle) flakes off from the sputtering target. The flat-plate-like sputtered particle or pellet-like sputtered particle is electrically charged and thus reaches the substrate while maintaining its crystal state, without being aggregation in plasma, forming a CAAC-OS layer.

First heat treatment may be performed after the oxide semiconductor layer 404b is formed. The first heat treatment may be performed at a temperature higher than or equal to 250° C. and lower than or equal to 650° C., typically higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate desorbed oxygen. By the first heat treatment, the crystallinity of the oxide semiconductor layer 404b can be improved, and in addition, impurities such as hydrogen and water can be removed from the base insulating layer 402 and the oxide semiconductor layer 404a. Note that the first heat treatment may be performed before etching for formation of the oxide semiconductor layer 404b.

A first conductive layer to be the source electrode 406a and the drain electrode 406b is formed over the oxide semiconductor layers 404a and 404b. For the first conductive layer, Al, Cr, Cu, Ta, Ti, Mo, W, or an alloy material containing any of these as a main component can be used. For example, a 100-nm-thick titanium layer is formed by a sputtering method or the like. Alternatively, a tungsten layer is formed by a CVD method or the like.

Figure 16D:
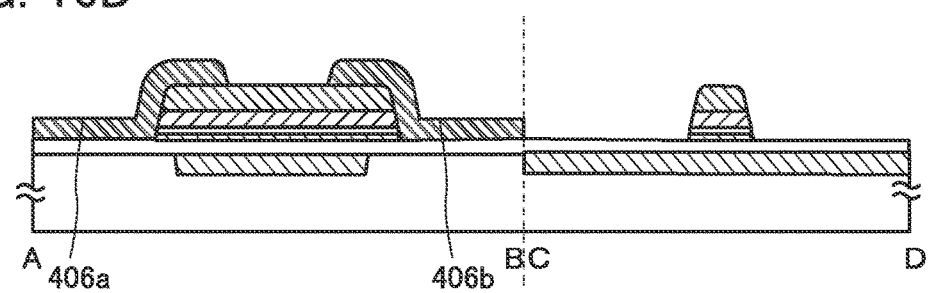

Then, the first conductive layer is etched so as to be divided over the oxide semiconductor layer 404b to form the source electrode 406a and the drain electrode 406b (see FIG. 16D).

Next, the oxide semiconductor layer 403c is formed over the oxide semiconductor layer 404b, the source electrode 406a, and the drain electrode 406b.

Note that second heat treatment may be performed after the oxide semiconductor layer 403c is formed. The second heat treatment can be performed in a condition similar to that of the first heat treatment. The second heat treatment can remove impurities such as hydrogen and water from the oxide semiconductor layer 403c. In addition, impurities such as hydrogen and water can be further removed from the oxide semiconductor layer 404a and 404b.

Figure 17A:
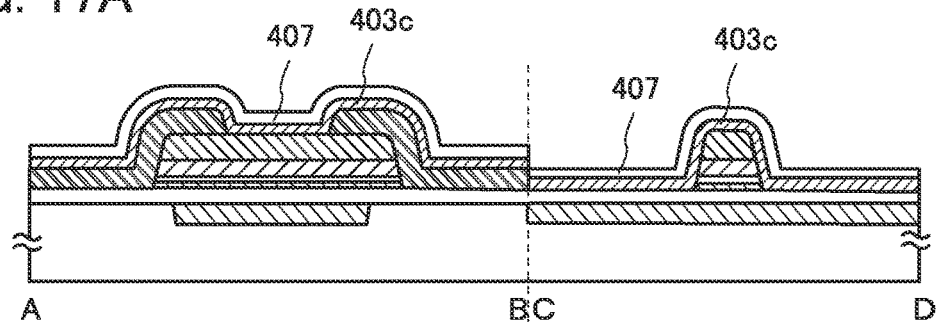
FIGS. 17A to 17C illustrate an example of a method for manufacturing a transistor.

Next, an insulating layer 407 to be the gate insulating layer 408 is formed over the oxide semiconductor layer 403c (see FIG. 17A). The insulating layer 407 can be formed by sputtering, CVD (including MOCVD, ALD, or PECVD), vacuum evaporation, PLD.

Figure 17B:
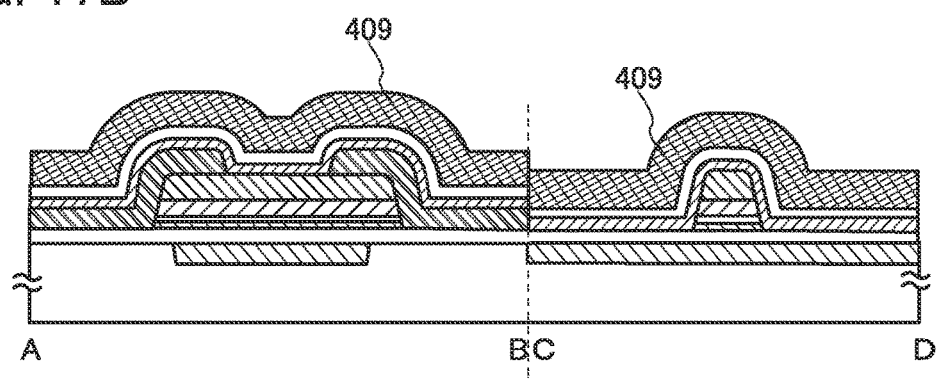

Then, a second conductive layer 409 to be the gate electrode 410 is formed over the insulating layer 407 (see FIG. 17B). For the second conductive layer 409, Al, Ti, Cr, Co, Ni, Cu, Y, Zr, Mo, Ru, Ag, Ta, W, or an alloy material containing any of these as its main component can be used. The second conductive layer 409 can be formed by a sputtering method, a CVD method, or the like. A stack including a conductive layer containing any of the above materials and a conductive layer containing nitrogen, or a conductive layer containing nitrogen may be used for the second conductive layer 409.

Figure 17C:
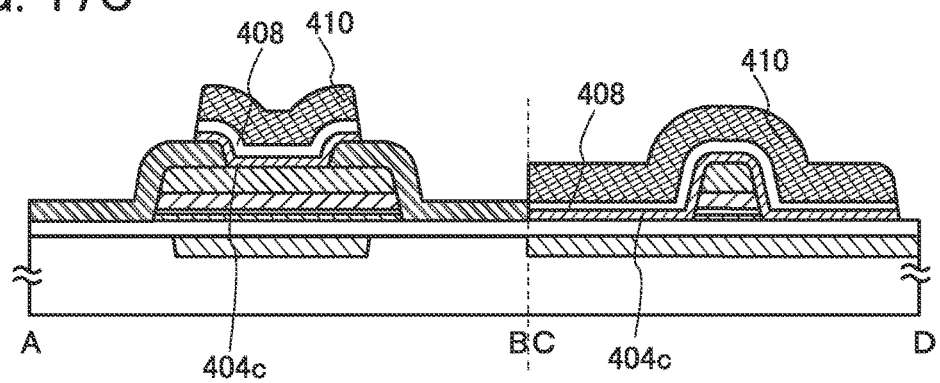

After that, the second conductive layer 409 is selectively etched using a resist mask to form the gate electrode 410 (see FIG. 17C). Note that as shown in FIG. 13C, the oxide semiconductor layer 404b is electrically surrounded by the gate electrode 410.

Then, the insulating layer 407 is selectively etched using the resist mask or the gate electrode 410 as a mask to form the gate insulating layer 408.

Subsequently, the oxide semiconductor layer 403c is etched using the resist mask or the gate electrode 410 as a mask to form the oxide semiconductor layer 404c.

The top edge of the oxide semiconductor layer 404c is aligned with the bottom edge of the gate insulating layer 408. The top edge of the gate insulating layer 408 is aligned with the bottom edge of the gate electrode 410. Although the gate insulating layer 408 and the oxide semiconductor layer 404c are formed using the gate electrode 410 as a mask, the gate insulating layer 408 and the oxide semiconductor layer 404c may be formed before the second conductive layer 409 is formed.

Next, the oxide insulating layer 412 is formed over the source electrode 406a, the drain electrode 406b, and the gate electrode 410 (see FIGS. 13B and 13C). A material and a method for the oxide insulating layer 412 can be similar to those for the first insulating layer 402a. The oxide insulating layer 412 may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or an oxide insulating layer containing nitrogen. The oxide insulating layer 412 can be formed by sputtering, CVD (including MOCVD, ALD, or PECVD), vacuum evaporation, PLD. The oxide insulating layer 412 preferably contains excessive oxygen so as to be able to supply oxygen to the multilayer semiconductor layer 404.

Next, third heat treatment may be performed. The third heat treatment can be performed under a condition similar to that of the first heat treatment. By the third heat treatment, excess oxygen is easily released from the base insulating layer 402, the gate insulating layer 408, and the oxide insulating layer 412, so that oxygen vacancies in the multilayer semiconductor layer 404 can be reduced.

Next, fourth heat treatment is performed. In the fourth heat treatment, the potential of the gate electrode 401 is kept higher than that of the source or drain electrode at a high temperature higher than or equal to 125° C. and lower than or equal to 450° C., for example higher than or equal to 150° C. and lower than or equal to 300° C. for one second or longer, for example, one minute or longer. As a result, the needed number of electrons moves from the multilayer semiconductor layer 404 toward the gate electrode 401 and some of them are trapped by the electron trap states existing inside the second insulating layer 402b or at the interface with another insulating layer. By controlling the number of trapped electrons, the degree of the threshold increase can be controlled.

Through the above process, the transistor 450 illustrated in FIGS. 13A to 13C can be fabricated.

This embodiment can be combined with any of the other embodiments in this specification as appropriate.

Embodiment 4

In this embodiment, a transistor having a planar structure that can be used as the transistor described in Embodiment 1 will be described.

Figure 18A:
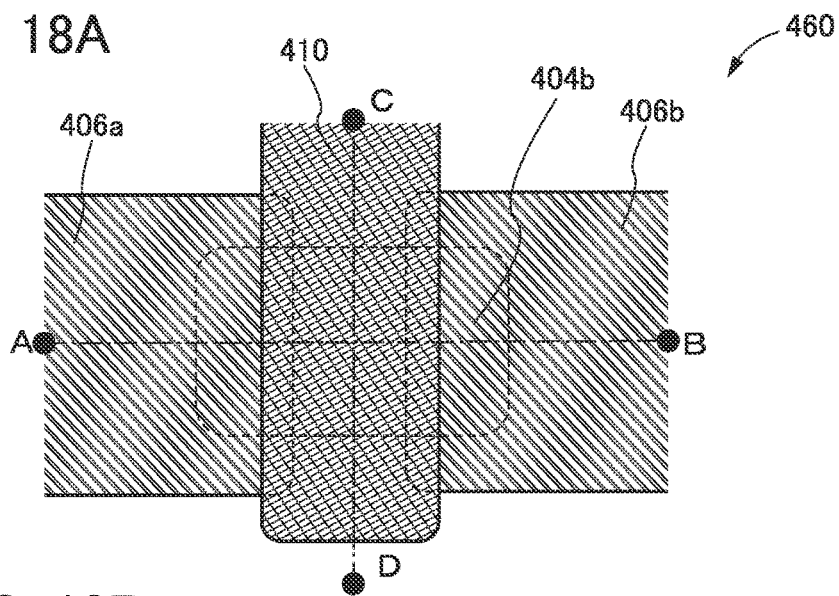
FIGS. 18A to 18C illustrate an example of a top view and cross-sectional views of a transistor.
Figure 18B:
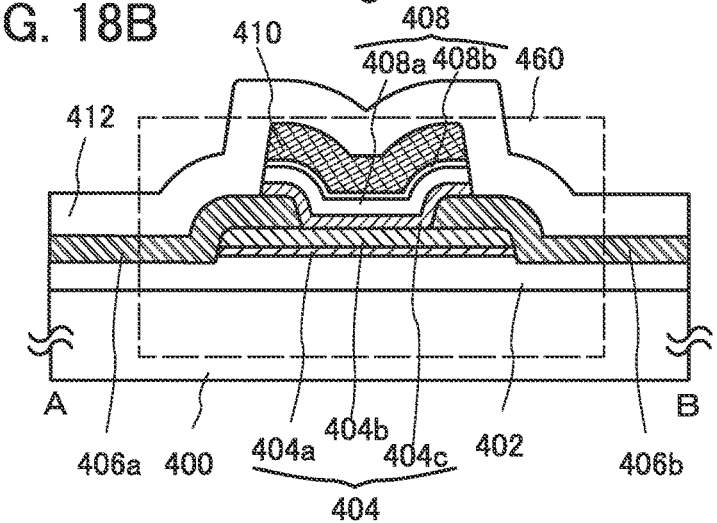
Figure 18C:
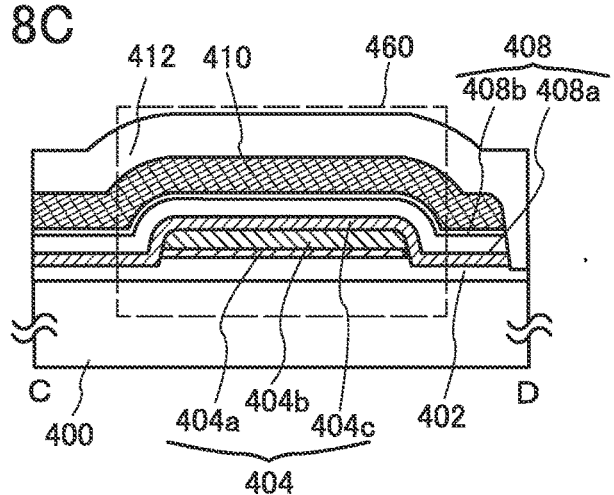

FIGS. 18A to 18C are a top view and cross-sectional views illustrating a transistor of one embodiment disclosed in this specification. FIG. 18B illustrates a cross section taken along the dashed-dotted line A-B in FIG. 18A. FIG. 18C illustrates a cross section taken along the dashed-dotted line C-D in FIG. 18A. Note that for simplification of the drawing, some components in the top view in FIG. 18A are not illustrated. In some cases, the direction of the dashed-dotted line A-B is referred to as a channel length direction, and the direction of the dashed-dotted line C-D is referred to as a channel width direction.

A transistor 460 illustrated in FIGS. 18A to 18C includes the base insulating layer 402 over the substrate 400; the oxide semiconductor layer 404a and the oxide semiconductor layer 404b over the base insulating layer 402; the source electrode 406a and the drain electrode 406b over the oxide semiconductor layer 404a and the oxide semiconductor layer 404b; the oxide semiconductor layer 404c in contact with the oxide semiconductor layer 404b, the source electrode 406a, and the drain electrode 406b; the gate insulating layer 408 over the oxide semiconductor layer 404c; the gate electrode 410 (corresponding to the gate electrode 103 in FIG. 1B) over the gate insulating layer 408; and the oxide insulating layer 412 over the source electrode 406a, the drain electrode 406b, and the gate electrode 410. The gate insulating layer 408 functions as the charge trap layer described in Embodiment 1, and thus includes a first insulating layer 408a (corresponding to the first insulating layer 102a in FIG. 1B) and a second insulating layer 408b (corresponding to the second insulating layer 102b in FIG. 1B). In addition, the multilayer semiconductor layer 404 includes the oxide semiconductor layers 404a, 404b, and 404c and corresponds to the semiconductor layer 101 in FIG. 1B.

The transistor 450 in Embodiment 2 is different from the transistor 460 in this embodiment in that each of the channel length and the channel width is more than or equal to twice, typically ten times as large as the thickness of the multilayer semiconductor layer 404.

Note that the channel length means the distance between a source (a source region, source electrode) and a drain (drain region, drain electrode) in a region where a semiconductor layer overlaps with a gate electrode in the top view. That is, the channel length in FIG. 18A is the distance between the source electrode 406a and the drain electrode 406b in the region where the oxide semiconductor layer 404b overlaps with the gate electrode 410. A channel width means a length of a portion where a source and a drain face and is parallel to each other and where a semiconductor layer and a gate electrode overlap with each other. In FIG. 18A, a channel width is thus a length of a portion where the source electrode 406a and the drain electrode 406b face each other and where the oxide semiconductor layer 404b and the gate electrode 410 overlap with each other.

Although this embodiment has a structure in which the oxide semiconductor layer 404b is sandwiched between the oxide semiconductor layers 404a and 404c, without limitation to this structure, a structure including only the oxide semiconductor layer 404b and not including the oxide semiconductor layers 404a and 404c is possible. Alternatively, a structure in which any one or two of the oxide semiconductor layer 404a, the oxide semiconductor layer 404b, and the oxide semiconductor layer 404c is/are provided is possible.

This embodiment can be combined with any of the other embodiments in this specification as appropriate.

Embodiment 5

The above-described semiconductor device can be used for display devices, laptops, or image reproducing devices provided with recording media (typically devices which reproduce the content of recording media such as DVDs (digital versatile disc) and have displays for displaying the reproduced images). Other than the above, as an electronic apparatuses which can use the semiconductor device according to an embodiment of the present invention, mobile phones, portable game machines, portable information terminals, e-book readers, video cameras, digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. Specific examples of such electronic apparatuses are shown in FIGS. 19A to 19F.

Figure 19A:
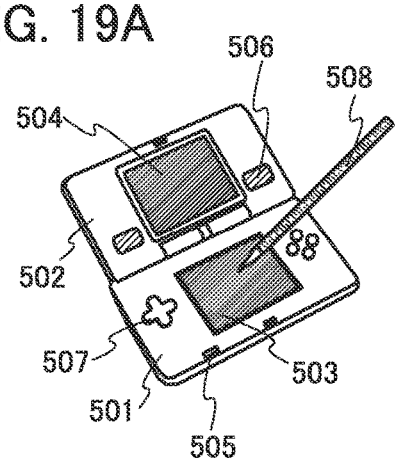
FIGS. 19A to 19F illustrate examples of an electronic device.

FIG. 19A illustrates a portable game machine including a housing 501, a housing 502, a display portion 503, a display portion 504, a microphone 505, a speaker 506, an operation key 507, a stylus 508, and the like. Although the portable game machine in FIG. 19A has the two display portions 503 and 504, the number of display portions included in a portable game machine is not limited to this.

Figure 19B:
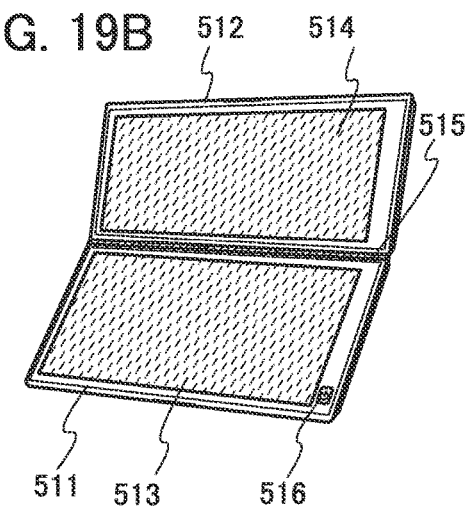

FIG. 19B illustrates a portable data terminal including a first housing 511, a second housing 512, a first display portion 513, a second display portion 514, a joint 515, an operation key 516, and the like. The first display portion 513 is provided in the first housing 511, and the second display portion 514 is provided in the second housing 512. The first housing 511 and the second housing 512 are connected to each other with the joint 515, and the angle between the first housing 511 and the second housing 512 can be changed with the joint 515. An image on the first display portion 513 may be switched depending on the angle between the first housing 511 and the second housing 512 at the joint 515. A display device with a position input function may be used as at least one of the first display portion 513 and the second display portion 514. Note that the position input function can be added by provision of a touch panel in a display device. Alternatively, the position input function can be added by provision of a photoelectric conversion element called a photosensor in a pixel area of a display device.

Figure 19C:
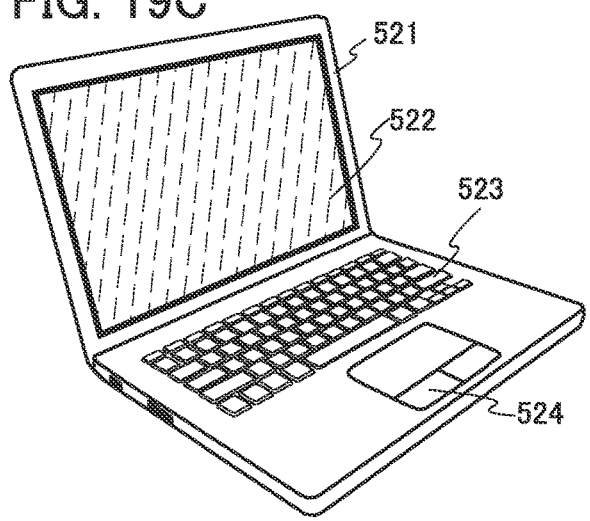

FIG. 19C illustrates a laptop personal computer, which includes a housing 521, a display portion 522, a keyboard 523, a pointing device 524, and the like.

Figure 19D:
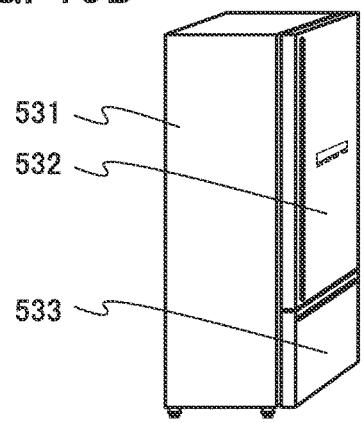

FIG. 19D illustrates the electric refrigerator-freezer including a housing 531, a door for a refrigerator 532, a door for a freezer 533, and the like.

Figure 19E:
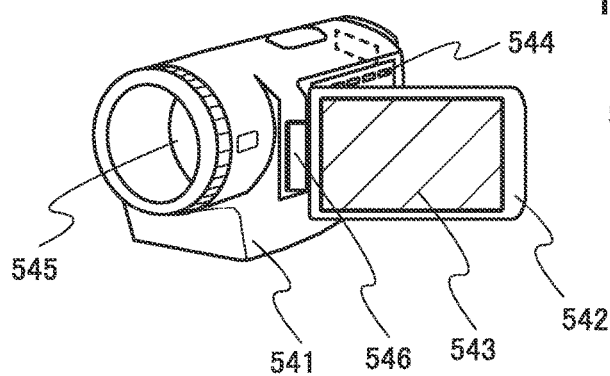

FIG. 19E illustrates a video camera, which includes a first housing 541, a second housing 542, a display portion 543, operation keys 544, a lens 545, a joint 546, and the like. The operation keys 544 and the lens 545 are provided for the first housing 541, and the display portion 543 is provided for the second housing 542. The first housing 541 and the second housing 542 are connected to each other with the joint 546, and the angle between the first housing 541 and the second housing 542 can be changed with the joint 546. Images displayed on the display portion 543 may be switched in accordance with the angle at the joint 546 between the first housing 541 and the second housing 542.

Figure 19F:
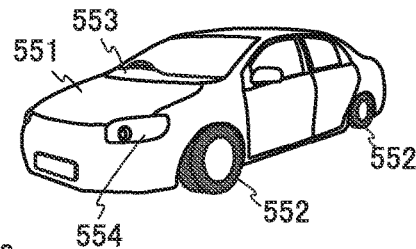

FIG. 19F illustrates a passenger car including a car body 551, wheels 552, a dashboard 553, lights 554, and the like.

This embodiment can be combined with any of the other embodiments disclosed in this specification as appropriate.

This application is based on Japanese Patent Application serial no. 2013-189222 filed with Japan Patent Office on Sep. 12, 2013, the entire contents of which are hereby incorporated by reference.

What is claimed is:

1. A method for manufacturing a semiconductor device comprising a first transistor and a second transistor,
   wherein the first transistor comprises:
   a first semiconductor;
   a first electrode in contact with the first semiconductor;
   a first gate electrode; and
   a first charge trap layer between the first gate electrode and the first semiconductor, and
   wherein the second transistor comprises:
   a second semiconductor;
   a second electrode in contact with the second semiconductor;
   a second gate electrode; and a second charge trap layer between the second gate electrode and the second semiconductor, and the method comprising the step of:

keeping a temperature at higher than or equal to 150° C. and lower than or equal to 300° C. while a first potential difference, between the first gate electrode and the first electrode, is different from a second potential difference, between the second gate electrode and the second electrode, wherein a threshold voltage of the first transistor and a threshold voltage of the second transistor are different from each other after keeping the temperature.

2. The method for manufacturing a semiconductor device, according to claim 1, wherein the first semiconductor comprises an oxide semiconductor.

3. The method for manufacturing a semiconductor device, according to claim 1, wherein the first charge trap layer comprises any one of hafnium oxide, aluminum oxide, and aluminum silicate.

4. The method for manufacturing a semiconductor device, according to claim 1, wherein the first electrode is a source electrode or a drain electrode.

5. The method for manufacturing a semiconductor device according to claim 1, wherein the first transistor comprises a third and a fourth semiconductor, with the fourth semiconductor being between the first semiconductor and the first charge trap layer, and wherein the second transistor comprises a fifth and a sixth semiconductor, with the sixth semiconductor being between the second semiconductor and the second charge trap layer.

6. The method for manufacturing a semiconductor device, according to claim 1, wherein the first potential difference is larger than the second potential difference, and wherein the threshold voltage of the first transistor is higher than the threshold voltage of the second transistor.

7. The method for manufacturing a semiconductor device, according to claim 1, wherein the first transistor comprises a third gate electrode, and wherein the first semiconductor is sandwiched between the third gate electrode and the first charge trap layer, and wherein the second transistor comprises a fourth gate electrode, and wherein the second semiconductor is sandwiched between the fourth electrode and the second charge trap layer.

8. The method for manufacturing a semiconductor device, according to claim 1, wherein the temperature is kept for longer than or equal to one minute and shorter than or equal to one hour.

9. A method for manufacturing a semiconductor device comprising a semiconductor chip including a first transistor, a second transistor, a first pad connected to the first transistor, and a second pad connected to the second transistor, wherein the first transistor comprises:
a first semiconductor;
a first electrode in contact with the first semiconductor;
a first gate electrode; and
a first charge trap layer between the first gate electrode and the first semiconductor, and wherein the second transistor comprises:
a second semiconductor;
a second electrode in contact with the second semiconductor;
a second gate electrode; and
a second charge trap layer between the second gate electrode and the second semiconductor, and the method comprising the steps of:

applying a different potential to the first pad and the second pad;

keeping a temperature at higher than or equal to 150° C. and lower than or equal to 300° C. while a first potential difference, between the first gate electrode and the first electrode, is different from a second potential difference, between the second gate electrode and the second electrode; and packaging the semiconductor chip with the first transistor and the second transistor, wherein a threshold voltage of the first transistor and a threshold voltage of the second transistor are different from each other after keeping the temperature.

10. The method for manufacturing a semiconductor device, according to claim 9, wherein the first semiconductor comprises an oxide semiconductor.

11. The method for manufacturing a semiconductor device, according to claim 9, wherein the first charge trap layer comprises any one of hafnium oxide, aluminum oxide, and aluminum silicate.

12. The method for manufacturing a semiconductor device, according to claim 9, wherein the first electrode is a source electrode or a drain electrode.

13. The method for manufacturing a semiconductor device, according to claim 9, wherein the first potential difference is larger than the second potential difference, and wherein the threshold voltage of the first transistor is larger than the threshold voltage of the second transistor.

14. The method for manufacturing a semiconductor device, according to claim 9, wherein the first transistor comprises a third gate electrode, wherein the first semiconductor is sandwiched between the third gate electrode and the first charge trap layer, wherein the second transistor comprises a fourth gate electrode, and wherein the second semiconductor is sandwiched between the fourth electrode and the second charge trap layer.

* * * * *